US009386688B2

(12) United States Patent
MacDonald et al.

(10) Patent No.: US 9,386,688 B2
(45) Date of Patent: Jul. 5, 2016

(54) INTEGRATED ANTENNA PACKAGE

(75) Inventors: James MacDonald, Chandler, AZ (US);
William McKinzie, III, Fulton, MD (US); Walter Parmon, Chandler, AZ (US); Lawrence Rubin, Sykesville, MD (US)

(73) Assignee: Freescale Semiconductor, Inc., Austin, TX (US)

( * ) Notice: Subject to any disclaimer, the term of this patent is extended or adjusted under 35 U.S.C. 154(b) by 974 days.

(21) Appl. No.: 12/945,825

(22) Filed: Nov. 12, 2010

(65) Prior Publication Data

US 2012/0119969 A1 May 17, 2012

(51) Int. Cl.
*H01Q 1/52* (2006.01)
*H05K 1/02* (2006.01)
*H01L 23/552* (2006.01)
*H01L 23/66* (2006.01)
*H01Q 1/22* (2006.01)
*H01Q 1/32* (2006.01)
(Continued)

(52) U.S. Cl.
CPC .......... *H05K 1/0236* (2013.01); *H01L 23/552* (2013.01); *H01L 23/66* (2013.01); *H01Q 1/2283* (2013.01); *H01Q 1/3233* (2013.01); *H01Q 9/0407* (2013.01); *H01Q 13/18* (2013.01); *H01Q 15/0086* (2013.01); *H01L 24/13* (2013.01); *H01L 24/16* (2013.01); *H01L 2223/6627* (2013.01); *H01L 2223/6677* (2013.01); *H01L 2224/13147* (2013.01); *H01L 2224/16225* (2013.01); *H01L 2224/16227* (2013.01); *H01L 2924/01019* (2013.01); *H01L 2924/1421* (2013.01); *H01L 2924/15311* (2013.01); *H01L 2924/167* (2013.01); *H01L 2924/16152* (2013.01); *H05K 1/181* (2013.01); *H05K 2201/09072* (2013.01); *Y10T 29/49016* (2015.01)

(58) Field of Classification Search
CPC ......... H01Q 17/00; H01Q 19/06; H01Q 1/52; H01Q 1/526; H01Q 5/335; H01Q 1/42
USPC .......... 343/909, 700 MS, 841, 851, 702, 705, 343/853
See application file for complete search history.

(56) References Cited

U.S. PATENT DOCUMENTS 4,096,457 A   6/1978  Snyder
4,268,803 A   5/1981  Childs et al.
(Continued)

FOREIGN PATENT DOCUMENTS

CN   101160597 A   4/2008
JP   2003008309 A   1/2003

OTHER PUBLICATIONS

Non-Final Office Action mailed Nov. 6, 2012 for U.S. Appl. No. 12/945,828, 17 pages.
(Continued)

*Primary Examiner* — Michael C Wimer
*Assistant Examiner* — Hasan Islam

(57) ABSTRACT

An integrated antenna package includes an interposer, an integrated circuit die, and a cap that forms a cavity within the integrated antenna package. A lossy ERG structure resides at the cap overlying the integrated circuit device. A lossless EBG structure resides at the cap overlying a microstrip feedline. A radar module includes a plurality of receive portions, each receive portion including a parabolic structure having a reflective surface, an absorber structure, a lens, and an antenna.

21 Claims, 32 Drawing Sheets

(51) Int. Cl.
*H01Q 9/04* (2006.01)
*H01Q 13/18* (2006.01)
*H01Q 15/00* (2006.01)
*H01L 23/00* (2006.01)
*H05K 1/18* (2006.01)

(56) References Cited

U.S. PATENT DOCUMENTS

| | | | |
|---|---|---|---|
| 4,320,402 A * | 3/1982 | Bowen | 343/700 MS |
| 4,697,192 A | 9/1987 | Hofer et al. | |
| 4,800,389 A | 1/1989 | Reger et al. | |
| 5,191,351 A | 3/1993 | Hofer et al. | |
| 5,508,696 A | 4/1996 | Tamura | |
| 5,821,454 A | 10/1998 | Babb et al. | |
| 6,262,495 B1 | 7/2001 | Yablonovitch et al. | |
| 6,337,661 B1 | 1/2002 | Kondoh et al. | |
| 6,426,722 B1 | 7/2002 | Sievenpiper et al. | |
| 6,483,481 B1 | 11/2002 | Sievenpiper et al. | |
| 6,580,395 B2 | 6/2003 | Koshizaka et al. | |
| 6,710,745 B2 | 3/2004 | Koshizaka et al. | |
| 6,862,001 B2 | 3/2005 | Kondoh et al. | |
| 6,906,674 B2 | 6/2005 | McKinzie, III et al. | |
| 6,949,707 B1 | 9/2005 | Tonomura | |
| 6,967,282 B2 | 11/2005 | Tonomura et al. | |
| 7,123,118 B2 | 10/2006 | McKinzie, III | |
| 7,142,822 B2 | 11/2006 | Tanaka et al. | |
| 7,157,992 B2 | 1/2007 | McKinzie, III | |
| 7,215,007 B2 | 5/2007 | McKinzie, III et al. | |
| 7,239,222 B2 | 7/2007 | Nagaishi et al. | |
| 7,250,835 B2 | 7/2007 | Higgins et al. | |
| 7,342,471 B2 | 3/2008 | McKinzie, III | |
| 7,414,491 B2 | 8/2008 | Higgins | |
| 7,449,982 B2 | 11/2008 | McKinzie, III | |
| 7,495,532 B2 | 2/2009 | McKinzie, III | |
| 7,525,509 B1 | 4/2009 | Robinson | |
| 7,852,281 B2 * | 12/2010 | Choudhury | 343/851 |
| 8,119,922 B2 * | 2/2012 | Worl | 174/257 |
| 2005/0040918 A1 | 2/2005 | Kildal | |
| 2009/0051467 A1 * | 2/2009 | McKinzie, III | 333/219 |
| 2010/0033389 A1 | 2/2010 | Yonak et al. | |
| 2010/0201465 A1 * | 8/2010 | McKinzie, III | 333/251 |
| 2012/0086463 A1 * | 4/2012 | Boybay et al. | 324/612 |

OTHER PUBLICATIONS

Abhari et al., "Metallo-Dielectric Electromagnetic Bandgap Structures for Suppression and Isolation of the Parallel-Plate Noise in High Speed Circuits," IEEE Trans on Microwave Theory and Techniques, vol. 51, No. 6, Jun. 2001, pp. 1629-1639.

Elek et al., "Dispersion Analysis of the Shielded Sievenpiper Structure Using Multiconductor Transmission Line Theory," IEEE Microwave and Wireless Components Letters, vol. 14, No. 9, Sep. 2004, pp. 434-436.

Yang et al., "Low Profile Antenna Performance Enhancement Utilizing Engineered Electromagnetic Materials," Chapter 34, Antenna Engineering Handbook, 4th Edition, McGraw-Hill 2007, printed from <www.digitalengineeringlibrary.com> on Nov. 29, 2010; 49 pages.

Ziroff et al., "A Novel Approach for LTCC Packaging Using a PBG Structure for Shielding and a Package Mode Suppression," 33rd European Microwave Conference, Munich, Germany, 2003, pp. 419-422.

Gauthier et al., "A 94-GHz Aperture-Coupled Micromachined Microstrop Antenna," IEEE Trans on Antennas and Propagation, vol. 47, No. 12, Dec. 1999, pp. 1761-1766.

Rogers, Shawn D., "Electromagnetic-Bandgap Layers for Broad-Band Suppression of TEM Modes in Power Planes," IEEE Trans on Microwave Theory and Techniques, vol. 53, No. 8, Aug. 2005, pp. 2495-2505.

Sievenpiper et al., "High-Impedance Electromagnetic Surfaces with a Forbidden Frequency Band," IEEE Trans on Microwave Theory and Techniques, vol. 47, No. 11, Nov. 1999, pp. 2059-2074.

Elek et al., "Simple Analytical Dispersion Equations for the Shielded Sievenpiper Structure," IEEE 2006, pp. 1651-1654.

Ziroff et al., "Improved Performance of Flip Chip Assembled MMIC Amplifiers on LTCC Using a Photonic Bandgap Structure," 34th European Microwave Conference, Amsterdam, 2004, pp. 93-96.

Liu et al., "Advanced Millimeter-Wave Technologies, Antennas, Packaging and Circuits," Chapter 10: EBG Materials and Antennas, John Wiley and Sons, United Kingdom, 2009, pp. 429-430.

U.S. Appl. No. 12/945,828, filed Nov. 12, 2010.

Final Office Action mailed Apr. 30, 2013 for U.S. Appl. No. 12/945,828, 14 pages.

First Office Action dated Jul. 22, 2015, for Chinese Patent Application No. 201110356537.8, 12 pages.

* cited by examiner

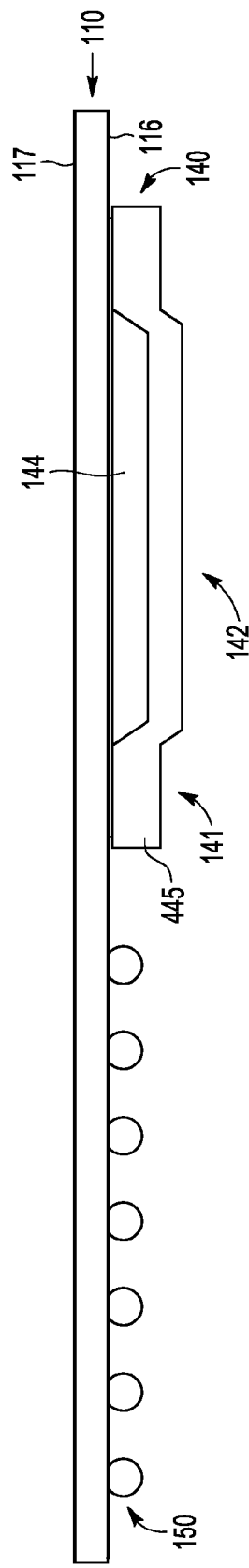
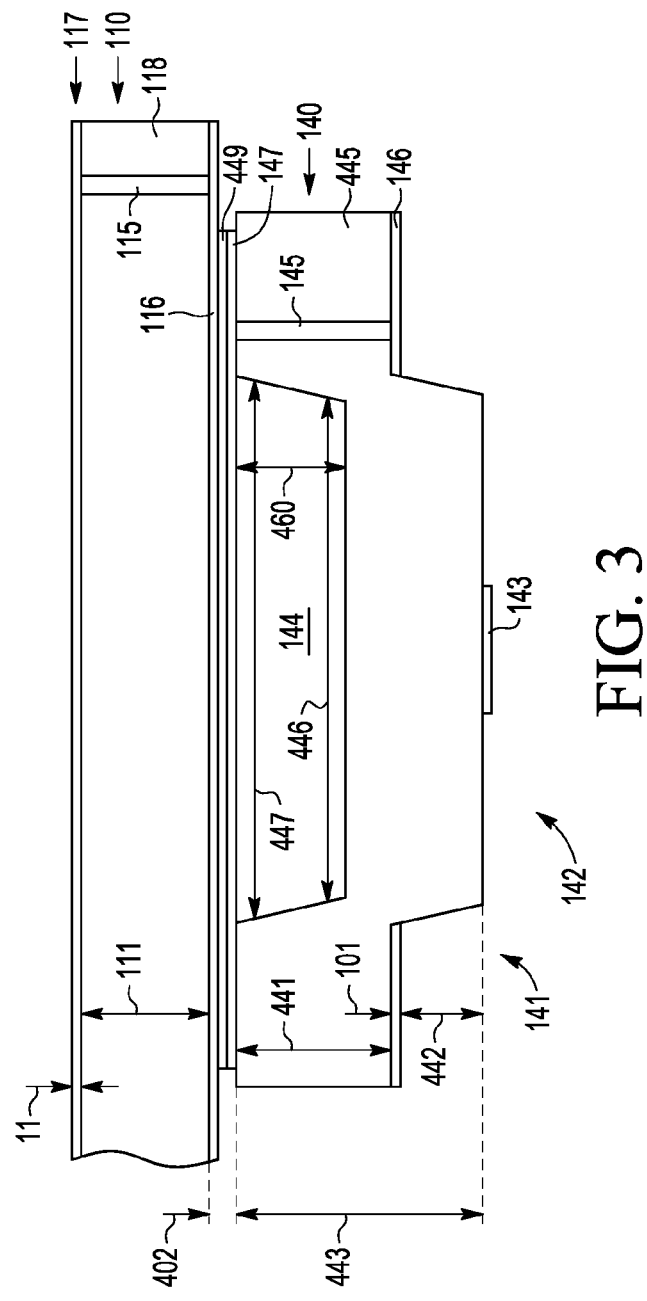

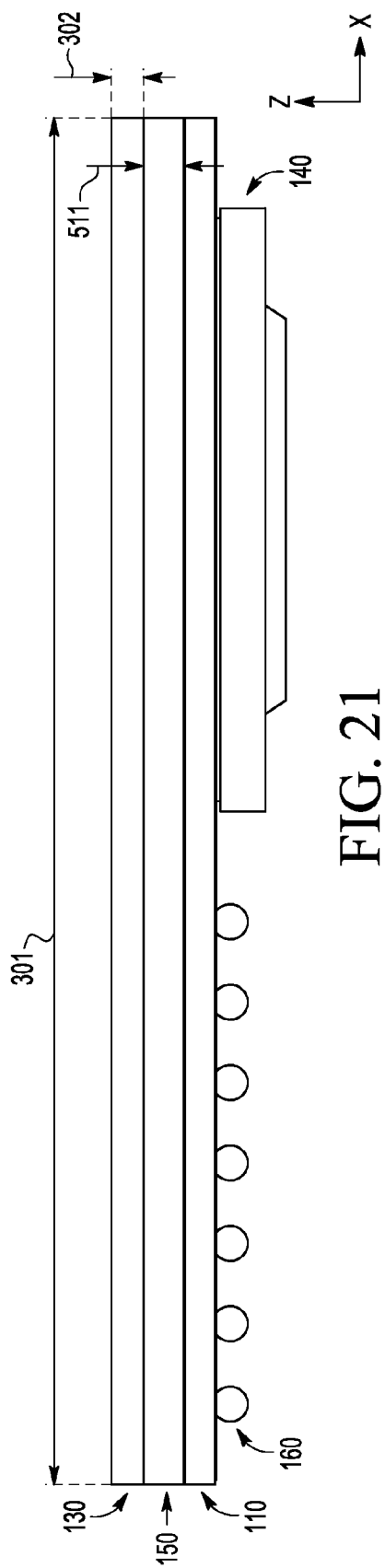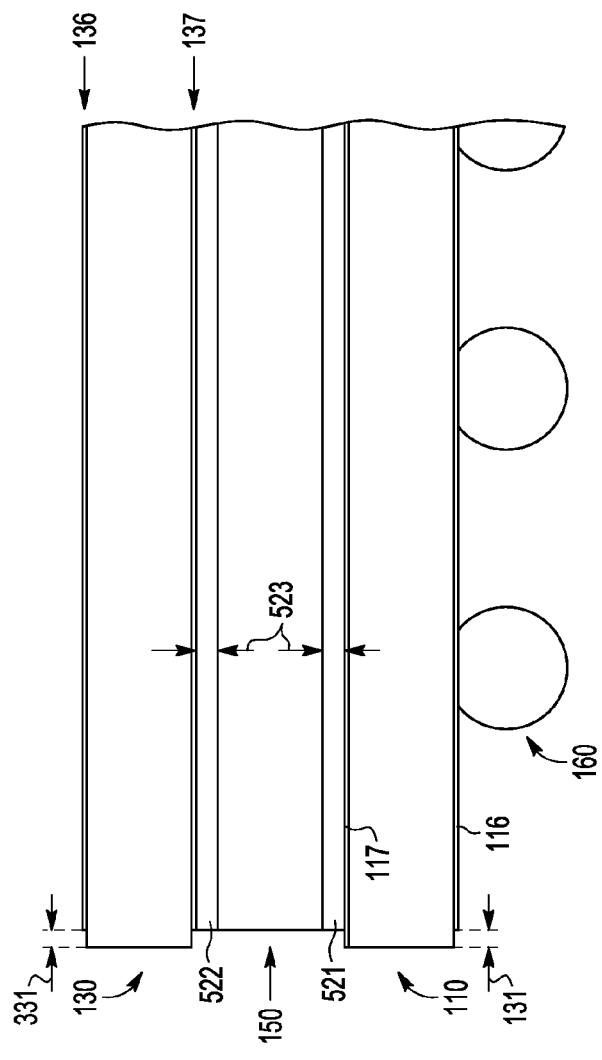

INTEGRATED ANTENNA PACKAGE

FIELD OF THE DISCLOSURE

The present disclosure relates generally to packaging, and more particularly to an integrated antenna package.

BACKGROUND

The packaging of integrated circuit die that operate at radio frequencies measured in millimeters can result in signal insertion losses and electro-magnetic interference. In addition, while reducing the size of electronic systems is a common goal amongst electronics manufacturers, doing so can increase the complexity of systems for a given performance as a result of the reduced size. Therefore, a low-cost radio frequency packaging solution for radar applications that reduces signal insertion losses and improves package isolation would be useful.

BRIEF DESCRIPTION OF THE DRAWINGS

The present disclosure may be better understood, and its numerous features and advantages made apparent to those skilled in the art by referencing the accompanying drawings.

FIG. 2 is a side view of a portion of integrated package of FIG. 1 in accordance with a specific embodiment of the present disclosure.

FIG. 3 is a side view of the portion of the integrated package of FIG. 2 in accordance with a specific embodiment of the present disclosure.

FIG. 21 is a side view of the integrated antenna device in accordance with a specific embodiment of the present disclosure.

FIG. 22 is a side view of a portion of a portion of the integrated antenna device of FIG. 21 in accordance with a specific embodiment of the present disclosure.

DETAILED DESCRIPTION

Figure 1:
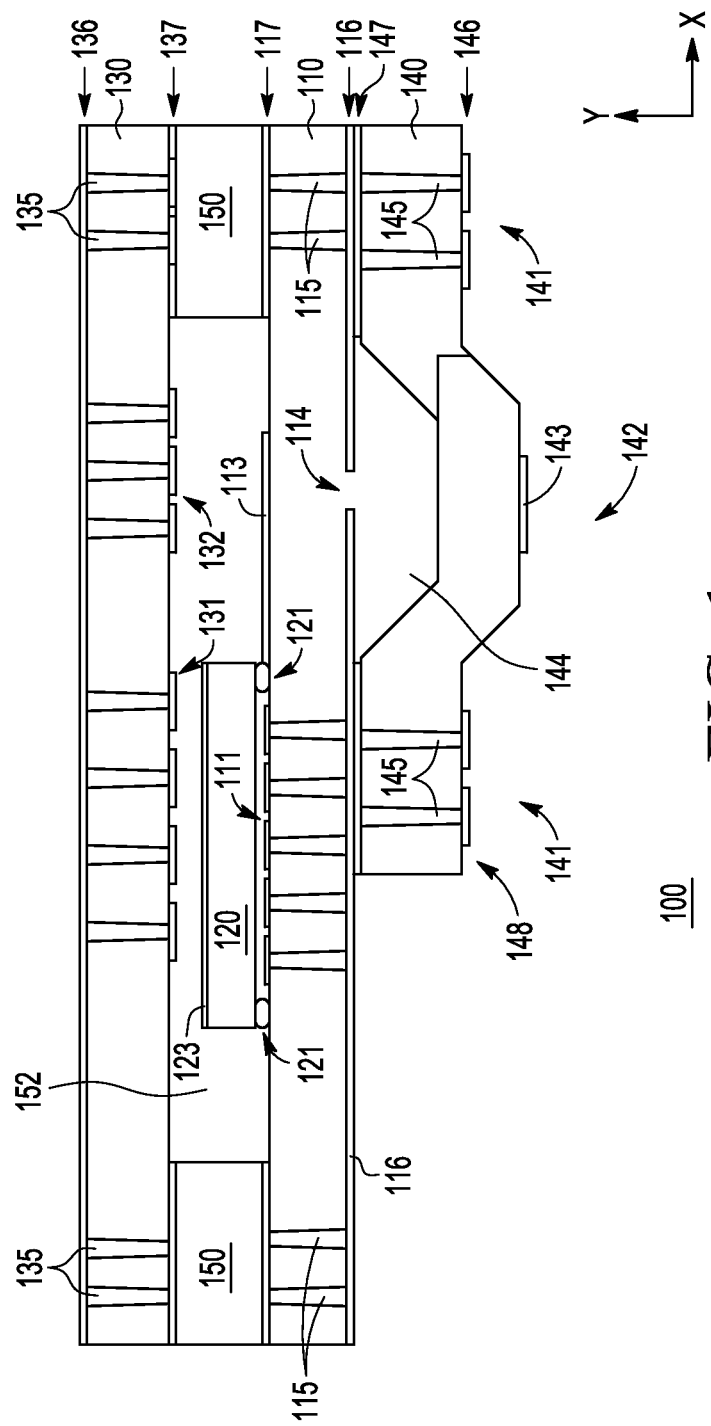
FIG. 1 is a side view of an integrated antenna package in accordance with a specific embodiment of the present disclosure.

An integrated antenna package is disclosed for use in low-cost commercial applications, such as radar module. The radar module is targeted for collision avoidance radar applications in accordance with a specific embodiment of the present disclosure. The integrated antenna package architecture includes an interposer that interfaces a die to a ball grid array (BGA) using flip-chip stud bump bonding techniques. A Radio Frequency (RF) signal transmission structure, such as coplanar waveguide (CPW), is integrated at the interposer to communicate an RF signal between the die and a microstrip feedline that is also integrated onto the interposer. A cap is attached to the interposer to encapsulate the die, the transmission structure, and the microstrip feedline in a cavity, thereby avoiding direct encapsulation of the die, which can cause undesirable variations in operating characteristics, such as the center frequency.

The cap that along with the interposer encapsulates the die includes different types of metamaterials to facilitate efficient operation of the integrated antenna package at a desired millimeter wave frequency, such as 77 GHz. In a specific embodiment, the different types of metamaterials include lossy and lossless metamaterials, such as lossy and lossless electromagnetic band-gap (EBG) surfaces, tuned to attenuate RF modes that can occur within the cavity of the integrated antenna package during operation. A slot resonator is formed at an opposing coplanar surface of the interposer from the microstrip feedline. An antenna structure that includes a printed antenna at an outer surface, such as patch antenna, is attached to an outer surface of the interposer to form a cavity over the slot resonator. During RF transmission, the slot resonator excites the patch antenna.

A specific embodiment of such an integrated package will be better understood with reference to FIGS. 1-32, which illustrates a radar module that obtains simultaneous transmit and receive operation by providing separate transmit and receive sections. The separate transmit and receive sections are each associated with respective antennas, and operate independently of each other section. The transmit system is achieved by providing power to a transmit antenna element which acts as the module primary feed, where the primary feed element can be a printed antenna, such as a patch antenna. The implementation of the feed antenna element can be any antenna element that can propagate electromagnetic (EM) energy, such as the patch antenna described with reference to the integrated circuit antenna herein. The transmit antenna element illuminates a secondary antenna or compound antenna such as a reflector surface, lens, or a combination of both, which re-radiates the EM energy in the desired direction of potential objects to be avoided. The transmit portion includes a separate reflector surface, independent of any other receive reflector surfaces. The receive system is achieved by a group of receive portions, each having a corresponding parabolic reflector that reflects nearly all of the EM energy toward a corresponding antenna element for a frequency range near a desired frequency. As discussed herein, the antenna element is a patch antenna, but the implementation of the receive antenna element can be any antenna element which can receive EM energy. These receive antennas are illuminated by a secondary antenna or compound antenna such as a parabolic reflector surface, lens, or a combination of both. The receive system section includes separate reflector surfaces, independent of the transmit reflector surface. The purpose of the receive reflector surface is to re-radiate the EM energy reflected from a radar signal, such as a transmit radar pulse, back from potential target objects. In addition, use of a polarizing filter minimizes the overall system susceptibility to radar clutter from the environment.

The combination of transmit and receive portions, secondary antenna elements, and system electronics are packaged into one or more housings that comprise the mechanical package, environmental package and mounting structure for the radar system. A specific embodiment of such radar module will be better understood with reference to FIGS. 33-42.

The specific embodiments illustrated herein are described with respect to a 77 GHz application. As discussed in greater detail subsequently, it will be appreciated that various shapes, dimensions, and materials indicated can vary so long as there particular purpose is maintained for a given frequency range.

FIG. 1 illustrates a cross sectional view of an integrated package 100 that is not drawn to scale in order to illustrate the relative location of various features. Integrated package 100 includes an interposer 110, a die 120, a cap 130, an antenna structure 140, and a spacer 150. The die 120 is a semiconductor die that can include circuits implemented using silicon, silicon-germanium, Gallium Arsenide, silicon nitride, and the like. Die 120 includes active and passive components, such as transistors, resistors, and capacitors, and is attached to the interposer 110 through interconnects 121 to communicate information between the die 120 and the interposer 110. In one embodiment, a transmitter die, or the transmitter portion of a transceiver die, includes an integrated PLL, power amplifier and local oscillator (LO) output and an on chip ramp generator.

In one embodiment, the interposer 110 is a high-resistivity silicon substrate having a resistivity in the range of at least 100 Ohm-cm, such approximately 1K to 3K Ohms-cm, with low loss tangent, and includes an inner conductive layer 117, an outer conductive layer 116, and through-substrate vias (TSVs) 115. The inner conductive layer 117 of the interposer includes a transmission structure 113, and the outer conductive layer 116 includes a slot resonator 114. A cavity is formed between the die 120 and interposer 110. A region 111 of the interposer 110 underlies the die 120 and includes a metamaterial, such as a near periodic lossy EBG structure to provide under-chip mode suppression. The cap 130 includes a high-resistivity silicon substrate having a resistivity of at least 100 Ohm-cm, such approximately 1-3K Ohms-cm, with low loss tangent, and is attached to the interposer 110 through the spacer 150 to create cavity 152. The cap 130 includes an outer conductive layer 136, an inner conductive layer 137, and TSVs 135. A region 131 of the cap 130 overlies the die 120 and includes a near-periodic lossy EBG structure. A region 132 of the cap overlies a microstrip portion of transmission structure 113 and is described to include a multilayer a periodic lossless EBG structure.

Antenna structure 140 is connected to the interposer 110, and has a central portion 142 that is surrounded by a periphery portion 141. Antenna structure 140 includes an outer conductive layer 146 at a major surface furthest from the interposer 110, an inner conductive layer 147 at a major surface closest to the interposer 110, and TSVs 145 connecting portions of the outer conductive layer 146 to the inner conductive layer 147. Outer conductive layer 146 includes a patch antenna 143, and periodic structures at the periphery portion 141 associated with a metamaterial, such as a lossless EBG structure. A cavity 144 resides between the antenna structure 140 and interposer 110. The integrated antenna of FIG. 1 will be discussed in greater detail with reference to FIGS. 2-28.

FIG. 2 illustrates a side view of a particular embodiment of the antenna structure 140 attached to the interposer 110. In addition to the elements illustrated at FIG. 1, FIG. 2 illustrates the relative locations of package interconnects 160, such as solder ball interconnects. Antenna structure 140 includes a high-resistivity silicon substrate 445 having a resistivity of at least 100 Ohm-cm, such 1K to 3K Ohms-cm, with low loss tangent attached to the interposer 110, an inner major surface that is nearest the interposer 110 and an outer major surface opposing the inner major surface. The inner major surface and the outer major surface of the antenna structures 140 each include multiple elevations including upper planar portions at central location 142 and lower planar portions at periphery location 141.

FIG. 3 illustrates a portion of FIG. 2 in greater detail including various features of antenna structure 140 and interposer 110. Illustrated features of the Antenna structure 140 include outer conductive layer 146, an inner conductive layer 147, cavity 144, and TSVs 145 (one illustrated at FIG. 3). The outer conductive layer 146 and the inner conductive layer 147 reside at opposing major surfaces of silicon substrate 445. Illustrated features of the interposer 110 include substrate 118, outer conductive layer 116, inner conductive layer, and TSVs 115 (one shown at FIG. 3). The conductive layers 116 and 117 reside at opposing major surfaces of the silicon substrate 118.

Each of the conductive layers 116, 117, 146, and 147 are patterned layers, and can comprise gold having a thickness of dimension 11. Note all dimensions are listed by reference number in Table 1.

The silicon substrate 445 of the antenna 140 has a thickness dimension 441 at the periphery location 141, and a thickness dimension from the outer lower planar surface at periphery location 141 to the outer upper planar portion at central location 142. A total thickness of the silicon substrate of antenna 140 is, therefore, dimension 443. A cavity 144 is formed by the interposer 110 and the antenna structure 140 having a height dimension 460. A length of the cavity 142 that is closest the interposer 110 is dimension 447, and a length of the cavity 142 that is furthest from the interposer 110 is dimension 446.

The inner conductive layer 147 of the antenna structure 140 is connected mechanically and electrically to the outer conductive layer 116 of the interposer 110 by a conductive layer 449, such as a conductive epoxy having a thickness of dimension 12 (not shown).

Figure 4:
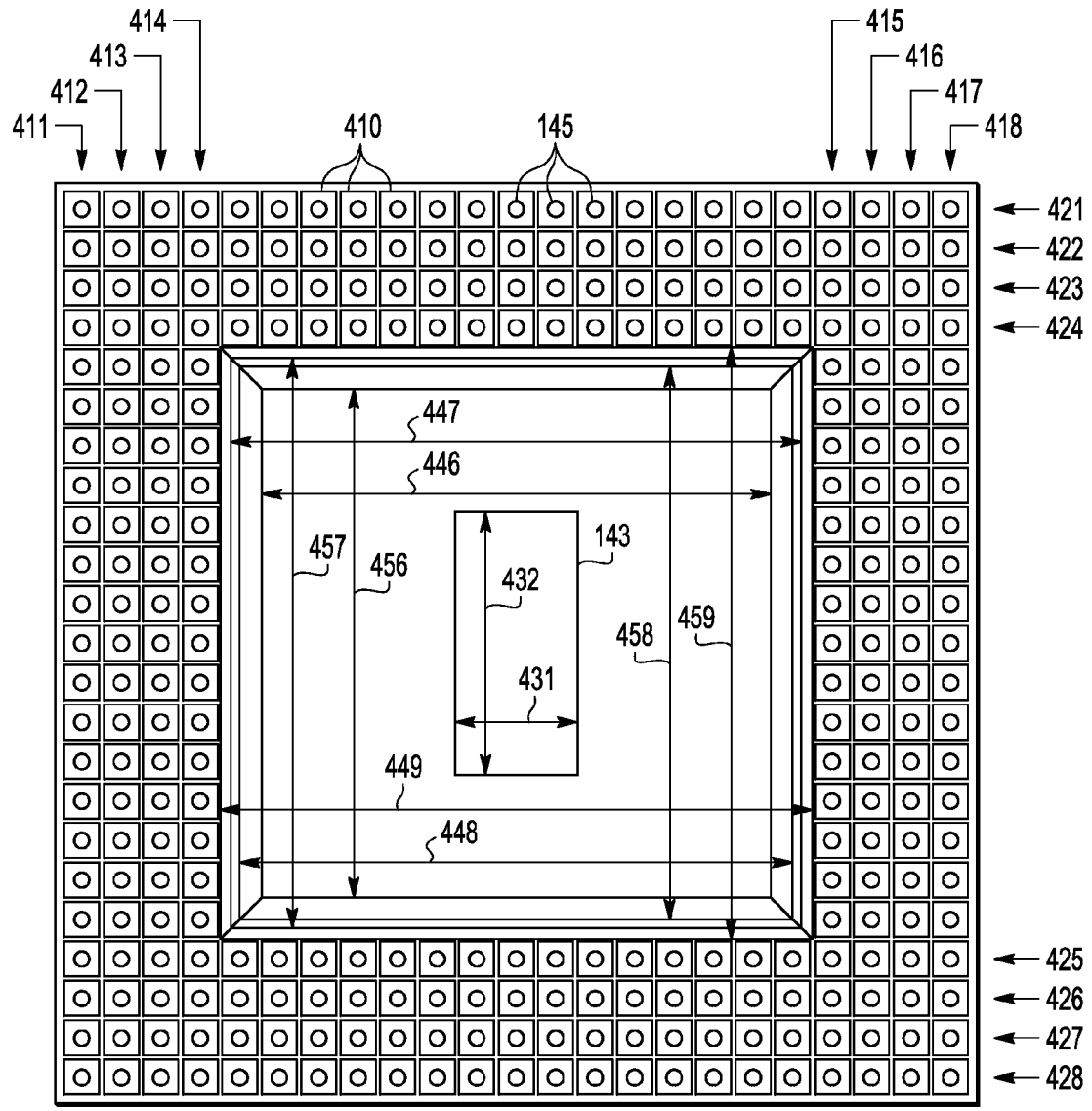
FIG. 4 is a plan view of the outer portion of the antenna structure of FIG. 2 in accordance with a specific embodiment of the present disclosure.

FIG. 4 illustrates a plan view of the outside of antenna structure 140 including the location of the inner cavity and the locations where TSVs 145 contact the outer conductive surface 146. The outer conductive surface 146 includes a patch antenna 143 and a plurality of periodic patches 410. Each patch of the plurality of patches 410 is defined by etching a conductive layer. The periodic patches 410 are laid out in columns 411-418, and rows 421-428 to form a grid structure with a constant gap between individual patches at the peripheral location 141 (FIG. 3) of the antenna structure 140. A plurality of TSVs 145 contact the plurality of patches 410, such that each patch 410 is in contact with a different TSV 145. The cavity 144 formed by antenna structure 140 has an x-dimension 447 and a y-dimension 457 at its widest, and an x-dimension 446 and a y-dimension 456 at its narrowest. The outer planar portion (at central location 142) of the antenna structure 140 has an x-dimension 448 and a y-dimension 458. An anisotropic etch of the silicon substrate results in a surface that transitions between the upper planar portions and the lower planar portions of the inner and outer surfaces, respectively, at an angle of 54.7 degrees that is based upon the result of a preferential wet etch process and the lattice structure of the silicon substrate. The outer periphery of the surface defining the 54.7 degree angle, where it meets the lower planar portion of the antenna structure 140, has an x-dimension 449 and a y-dimension 459. A patch antenna 143 having an x-dimension 431 and a y-dimension 432 resides at the upper planar portion, and is centered over the cavity 144.

Figure 5:
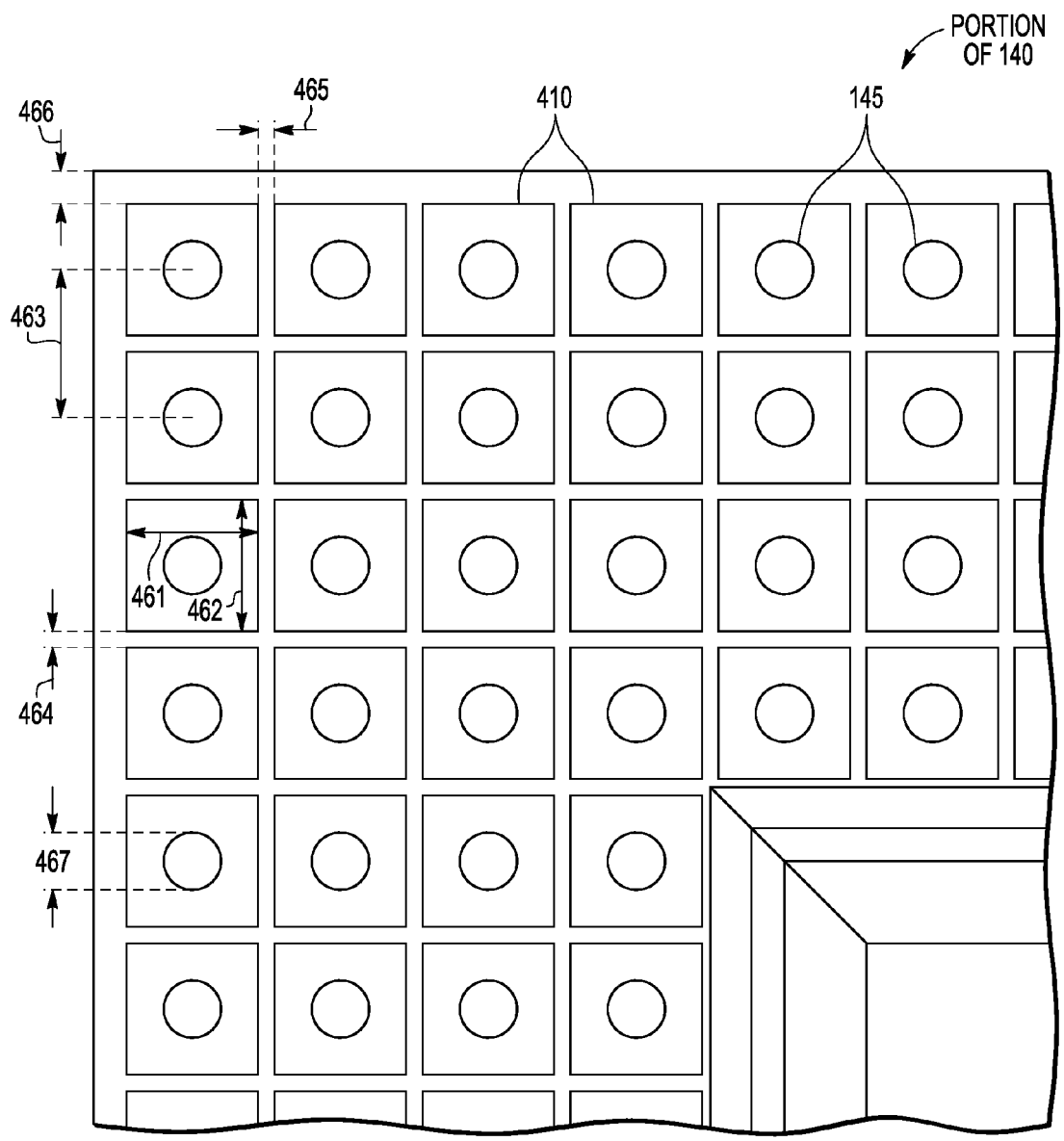
FIG. 5 is a plan view of the outer portion of the antenna structure of FIG. 4 in accordance with a specific embodiment of the present disclosure.

FIG. 5 illustrates a portion of the antenna structure 140 of FIG. 4 in greater detail to identify various dimensions. In particular, each patch 410 has an x-dimension 461, a y-dimension 462, a period dimension 463 between adjacent patches in the same column or row, a gap dimension 464 between adjacent patches of the same column or row, and the outer-most patches are offset from the edge of the antenna structure 140 by dimension 466. TSVs 145 are centered within the patches 410, and therefore have the same period dimension 463 as the patches 410. TSVs 145 have a diameter dimension 467 where they connect to the patches 145.

Figure 6:
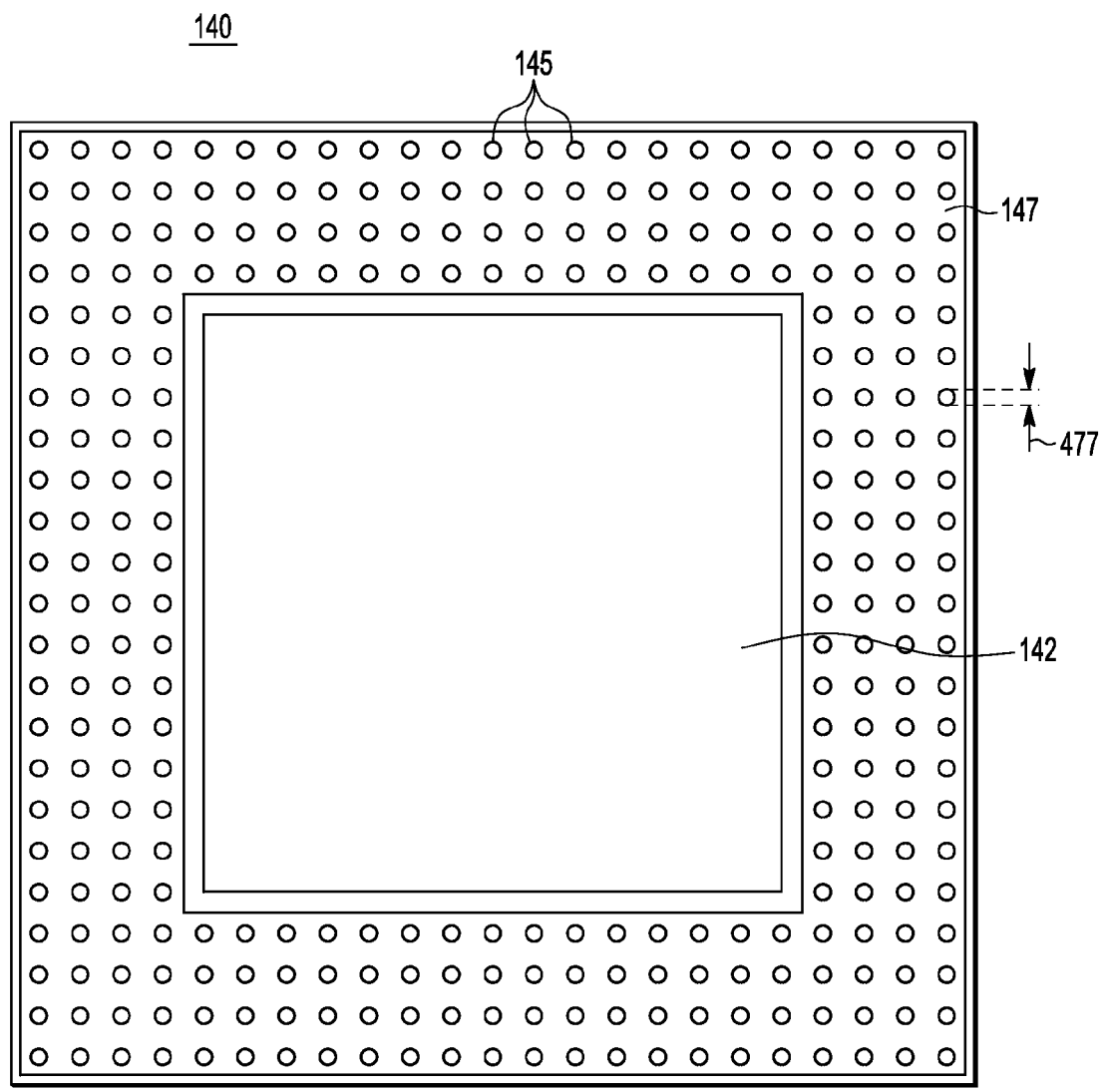
FIG. 6 is a plan view of the inner portion of the antenna structure of FIG. 3 in accordance with a specific embodiment of the present disclosure.

FIG. 6 illustrates a plan view of the inner portion of antenna structure 140 including the inner conductive layer 147, the cavity structure 144, and relative locations of TSVs 145 where they contact conductive layer 147. TSVs 145 have a diameter of 477 where they connect to the conductive layer 147.

Figure 7:
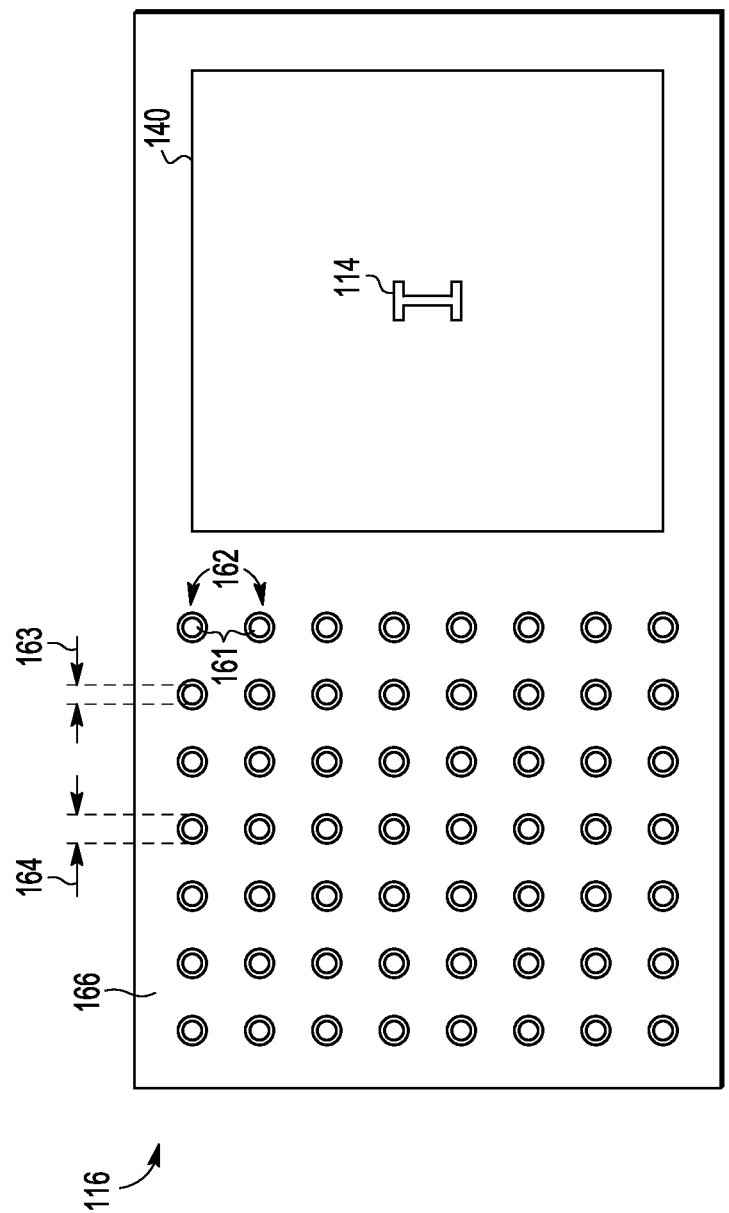
FIG. 7 is a plan view of the outer portion of the integrated package portion of FIG. 2 in accordance with a specific embodiment of the present disclosure.

FIG. 7 illustrates a plan view of the outer conductive layer 116 of interposer 110 and the relative location of the antenna structure 140. The outer conductive layer 116 includes a ground plane 166, and a plurality of solder-ball pads 161 surrounded by, and electrically isolated from, ground plane 166. The solder-ball pads 161 are connected to underlying TSVs (not shown) that are also connected to inner conductive layer 117, the solder-ball pads are the structures to which the ball-type package interconnects 160 (FIG. 2) are attached. The diameter of the solder ball pads 161 is dimension 163. An opening in the ground plane 166 defines the slot resonator 114, as described in greater detail herein.

Figure 8:
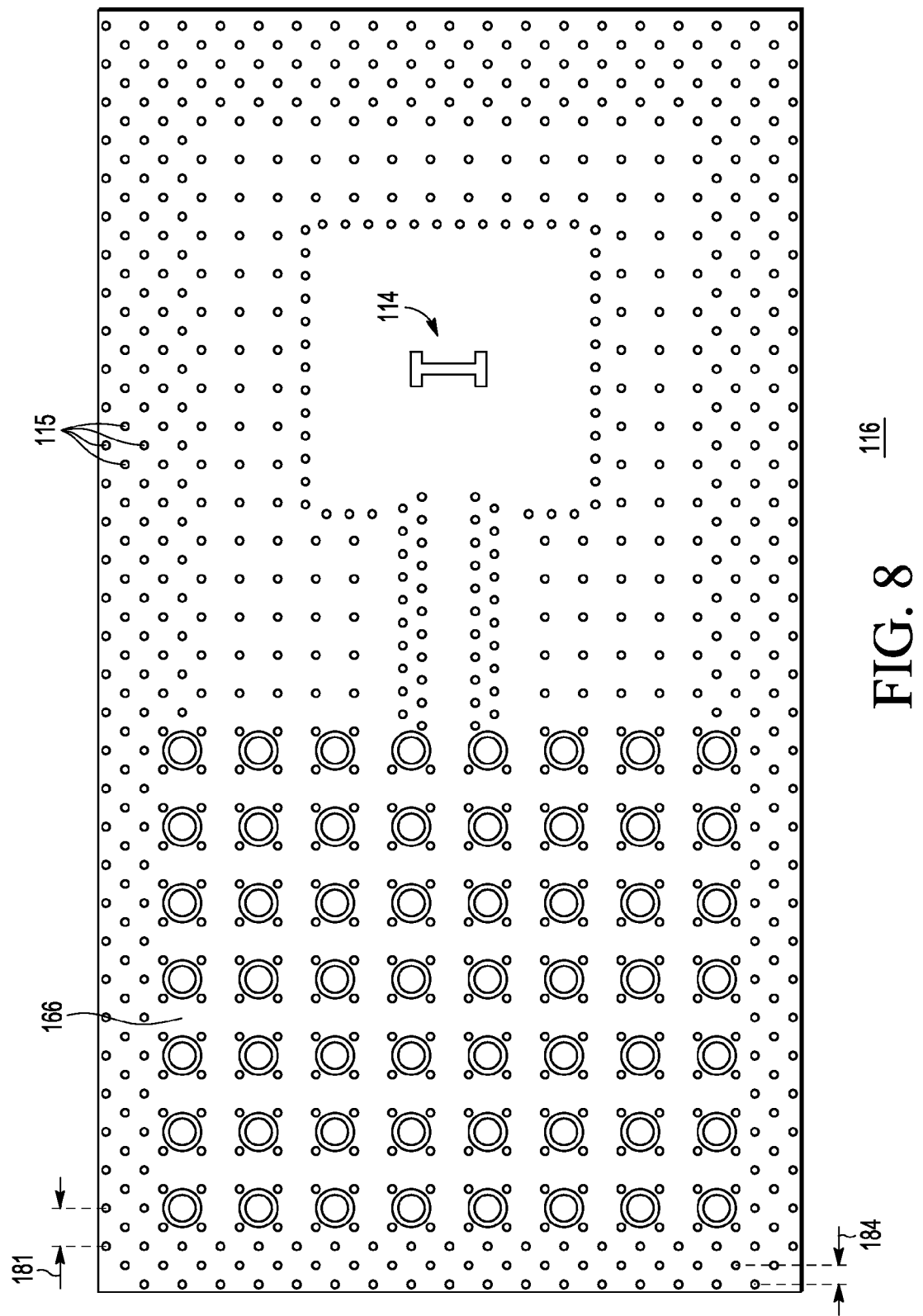
FIG. 8 is a plan view of an outer portion of the interposer in accordance with a specific embodiment of the present disclosure.

FIG. 8 illustrates a plan view of the outer conductive layer 116 of FIG. 7, and includes the locations where a plurality of TSVs 115 residing in the silicon substrate 445 of the interposer 110 contact the conductive layer 116. Four concentric rings of TSVs 115 are located in the silicon substrate 445 near the periphery of the conductive layer 116. Each concentric ring of TSVs 115 is offset from adjacent concentric TSV rings to form a square lattice, rotated 45 degrees from an edge, that provides a close packing of vias that substantially attenuates the EM penetration to provide improved isolation between various regions. The period of the TSVs within each row is dimension 181. The period between rows of TSVs is dimension 184. Fifth and sixth rows of TSVs 115 are located near the right-side portion of the periphery of the interposer 110 to define partial concentric rings.

Figure 9:
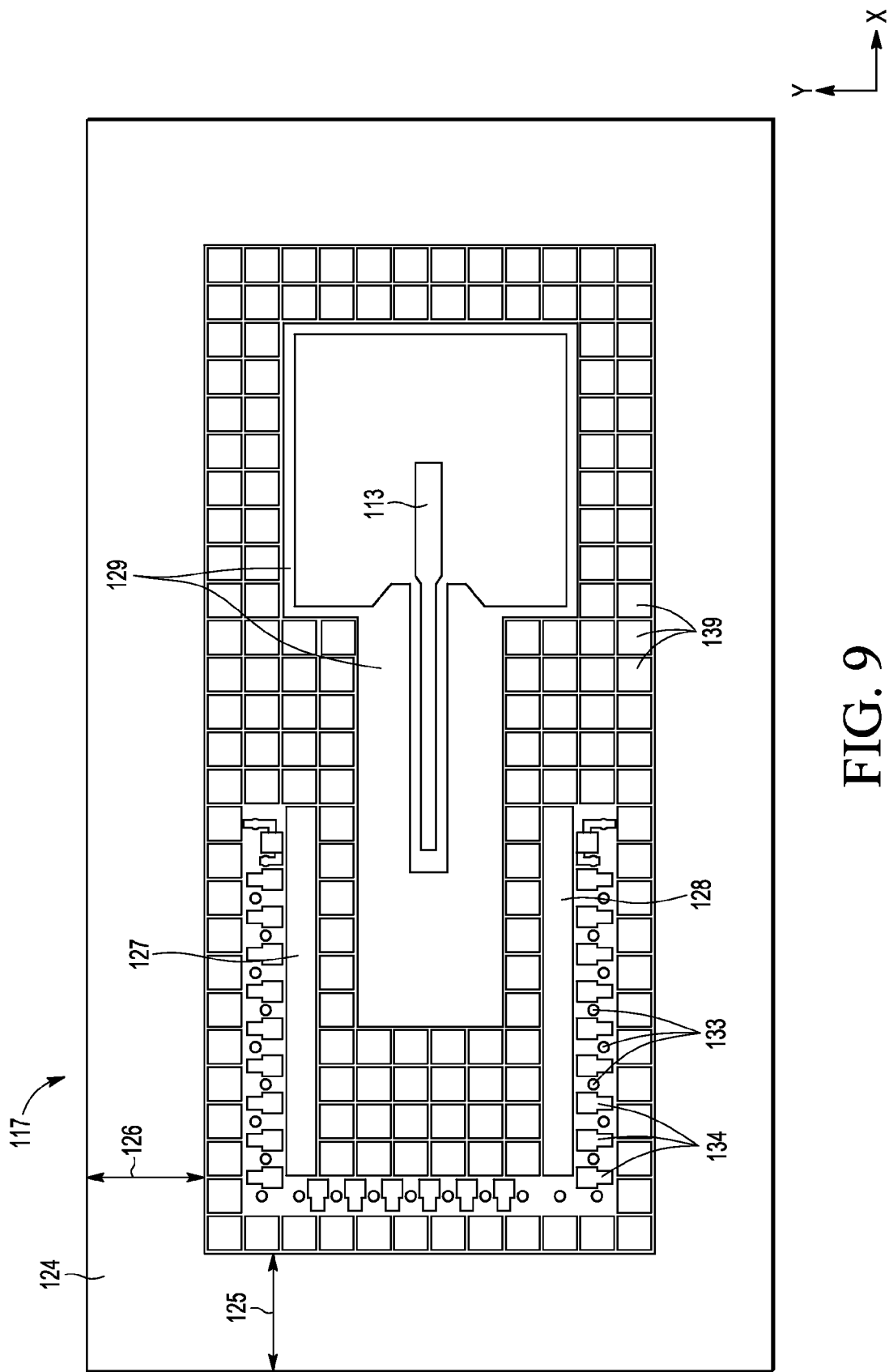
FIG. 9 is a plan view of an inner portion of the interposer 110 in accordance with a specific embodiment of the present disclosure.
Figure 10:
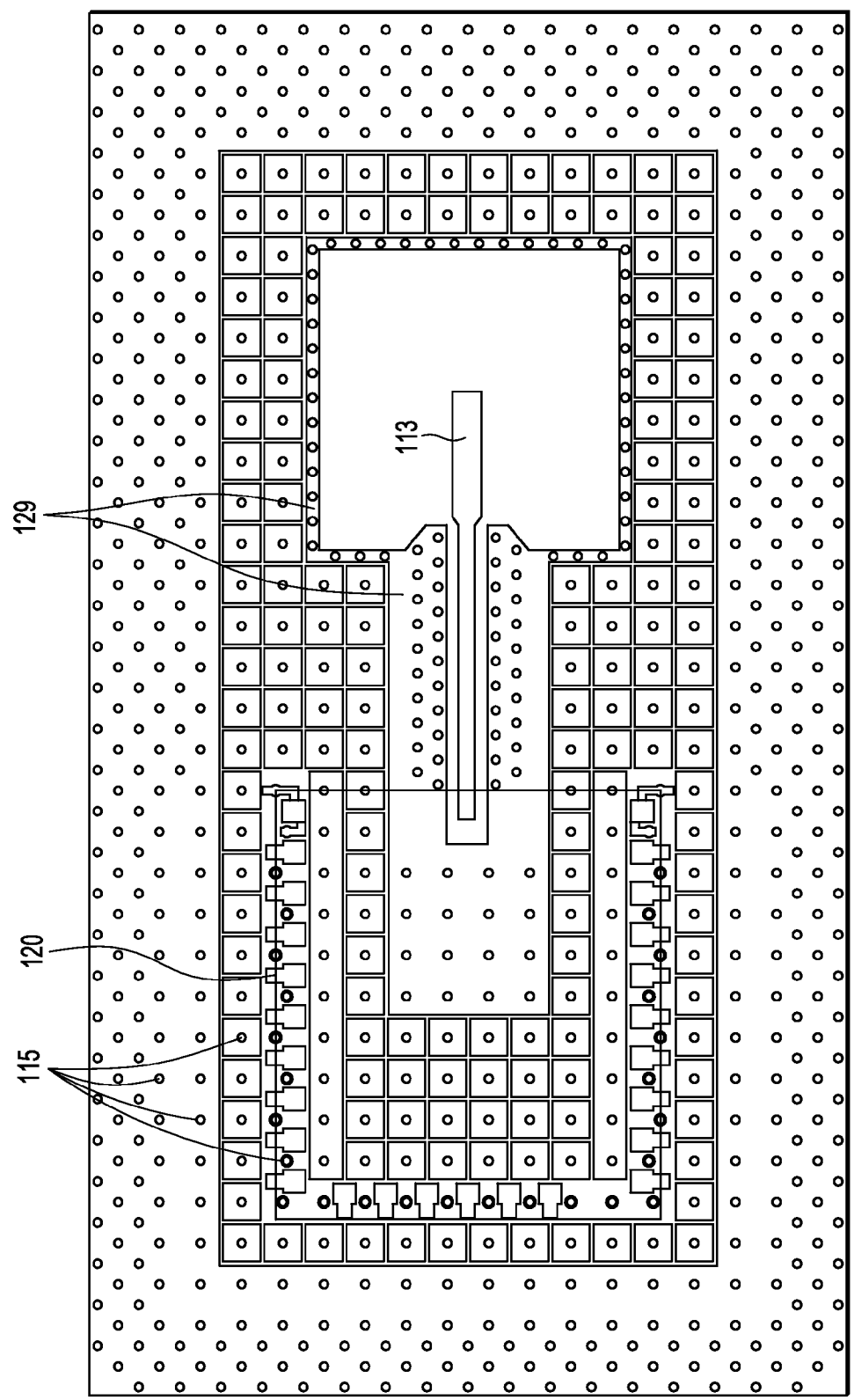
FIG. 10 is the plan view of FIG. 9 showing the location of through-substrate vias in accordance with a specific embodiment of the present disclosure.

FIG. 9 illustrates a plan view of an inner conductive layer 117 of the interposer 110. Conductive layer 117 includes a conductive annular structure 124 that defines a ground ring, a plurality of die pads 134, a plurality of isolated TSV landings 133, conductive structures 127-129, the transmission structure 113, and patches 139. The die pads 134 are conductive structures that will be attached to bump structure interconnects 121 of the die 120, thereby facilitating flip-chip attachment of the die 120 to the interposer 110. Each of the conductive annular structure 124, isolated TSV landings 133, conductive structures 127-129, and patches 139 are in contact with corresponding TSVs 115 as illustrated at FIG. 10. Note that the TSVs 115 are also connected to ground plane 166 (FIG. 8) of the outer conductive layer 116 at the opposing surface of the interposer 110.

Figure 11:
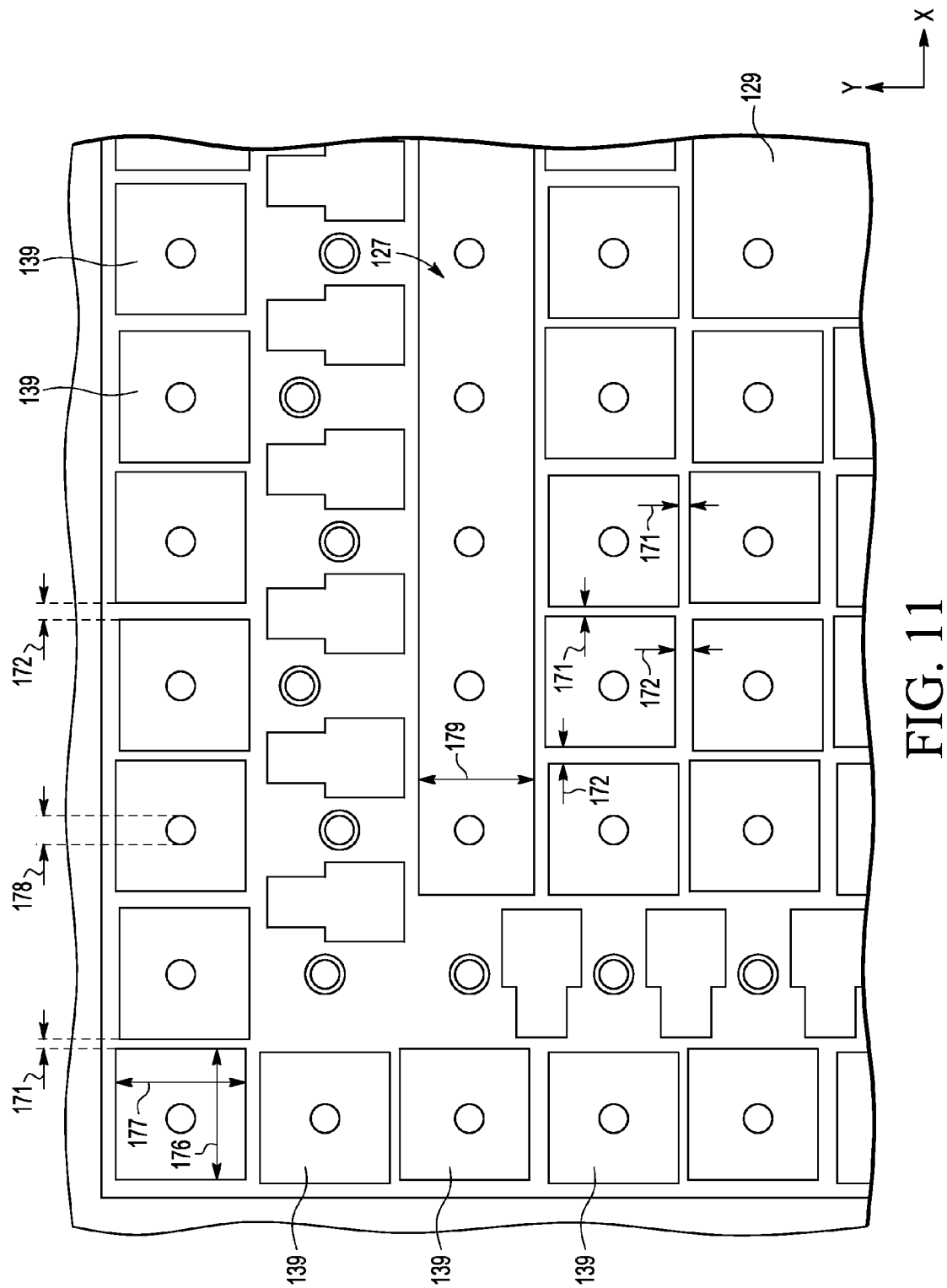
FIG. 11 is a portion of the plan view of FIG. 9 showing a portion of the interposer in greater detail in accordance with a specific embodiment of the present disclosure.

FIG. 11 illustrates a portion of FIG. 10 in greater detail. Each of the patches 139 has an x-dimension 176 and a y-dimension 177. The gap between adjacent patches varies in a repeated pattern between the dimension 171 and the dimension 172 in an alternating manner as indicated, and therefore the patch array can be referred to as near-periodic with an average period between patches equal to one-half the period between every other patch. The dimension 178 is the diameter of TSVs 115 where they contact the conductive layer 117. Conductive structure 127 has a y-dimension 179. Note that conductive structures 128 (FIG. 9) and 127 have the same dimensions.

Figure 12:
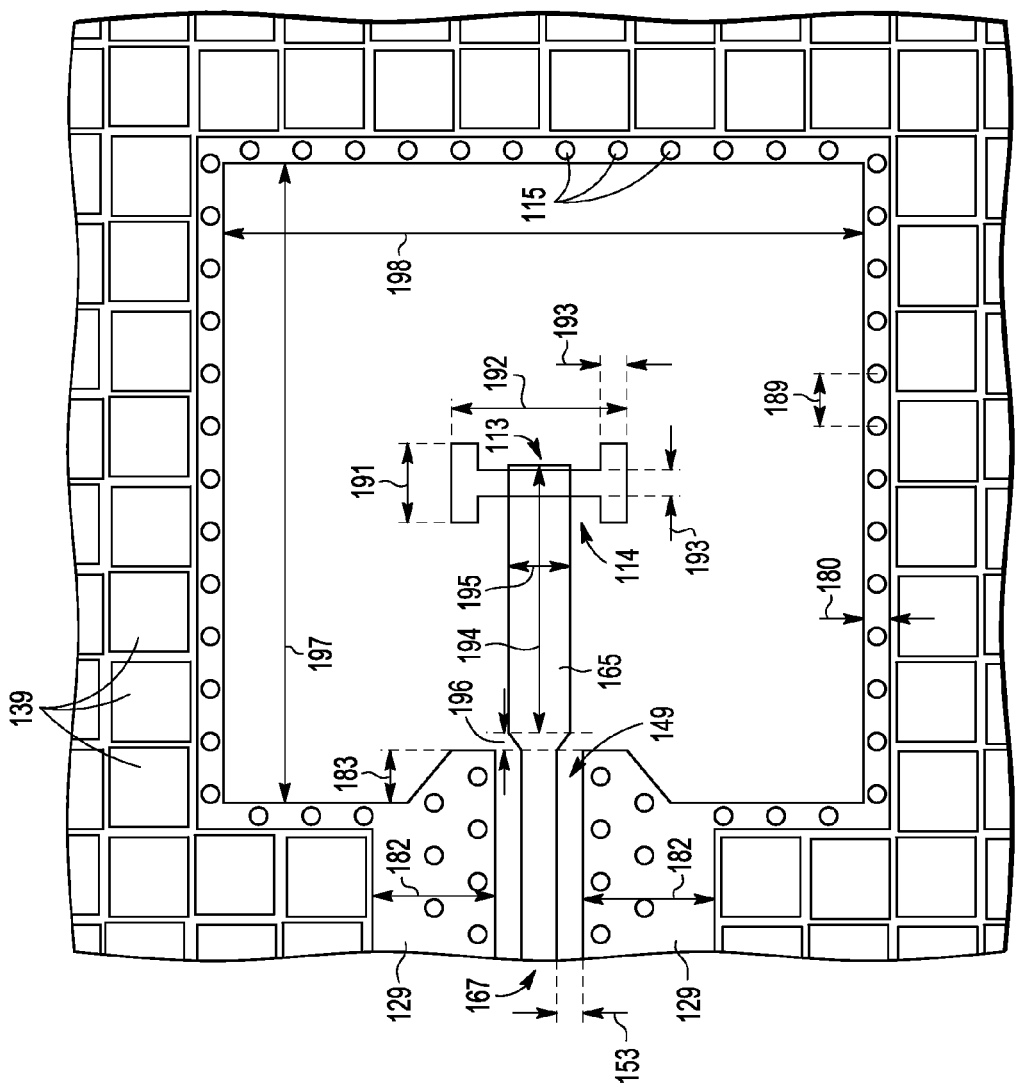
FIG. 12 is a portion of the plan view of FIG. 9 showing a portion of the interposer in greater detail in accordance with a specific embodiment of the present disclosure.

FIG. 12 illustrates another portion of FIG. 10 in greater detail including the relative locations of the slot resonator 114 to various conductive portions of the inner layer 117 of the interposer 110, and TSVs 115.

The specific embodiment of slot resonator 114 is an I-shaped opening in the outer conductive layer 116 of the interposer 110 and has a gap dimension 193, an x-dimension 191, and a y-dimension 192. A coplanar wave guide (CPW) at the inner conductive layer 117 includes portions of transmission structure 113 and conductive structure 129, which is a ground plane, that are separated by dimension 153 in the y-direction. In particular, the thinner conductive portion 167 of transmission structure 113 is the conductor portion of the CPW that is connected to the thicker portion of transmission structure 113 referred to as a microstrip feedline 165. The microstrip feedline 165 has an x-dimension 194, and a y-dimension 195. A transition 196 resides between the microstrip feedline 165 and the conductor portion 167.

A ring portion of the conductive structure 129 that surrounds the slot resonator 114 has a width dimension 180. A thicker portion of the conductive structure 129 on either side of the thinner portion of the transmission structure 114, which is part of the CPW, has a y-dimension 182, and extends past the ring portion of the ground plane 139 in the direction of the microstrip feedline 165 by dimension 183. The exposed substrate of the interposer 110 within the ring portion of conductive structure 129 defines an aperture having an x-dimension 197 and a y-dimension 198. TSVs 115 contact the conductive structure 129 in a manner to surround the conductive portion 167 of the CPW and the aperture with a period dimension 189 between adjacent TSVs 115. The total length of the transmission structure 113 that includes the microstrip feedline 165 and CPW conductor 175 is x-dimension 185 (not illustrated).

Referring back to FIG. 10, it will be appreciated that each one of the patches 139 is connected to the ground plane 166 at the opposing side of the interposer 110 by a corresponding TSV 115. This combination of patch 139, TSV 115, and ground plane 166 defines an EBG unit cell, a plurality of which in combination defines metamaterial referred to as an EBG structure. Similarly, referring back to the antenna structure of FIG. 4, it will be appreciated that each combination of a patch 410, TSV 145, and conductive layer 147 define an EBG unit cell a plurality of which form a metamaterial that is also an EBG structure integrated with the antenna structure 140. The EBG structures described herein have been selected to support a 77 GHz radar application.

Two types of EBG unit cells are referred to herein. A first type of EBG unit cell is referred to herein as a lossless EBG unit cell that is used in combination with other lossless EBG unit cells to form a lossless EBG structure, wherein a lossless EBG structure is so named because it does not significantly absorb the power in transverse electric modes (TE modes) over a desired frequency range. Therefore, while the TE modes may undergo a reactive attenuation they do not undergo an absorptive attenuation. In one embodiment, lossless EBG unit cells are implemented by ensuring the patches of adjacent ERG unit cells are electrically isolated from each other, wherein adjacent patches are considered electrically isolated from each other if an effective resistance between them is large, such as greater than 10 MOhms. Note that the term "effective resistance" as used herein with respect to the effective resistance between EBG unit cell patches refers to the direct (DC) resistance that would be measured, assuming adjacent EBG patches where not electrically connected through their respective TSVs and underlying ground plane. The EBG structure of antenna structure 140 is a lossless EBG structure.

Figure 13:
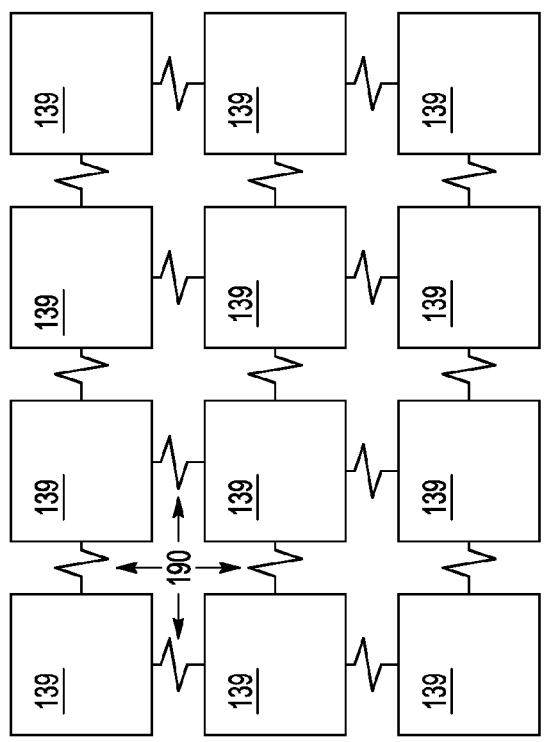
FIG. 13 is a portion of the patches illustrated in the plan view of FIG. 9 in accordance with a specific embodiment of the present disclosure.
Figure 14:
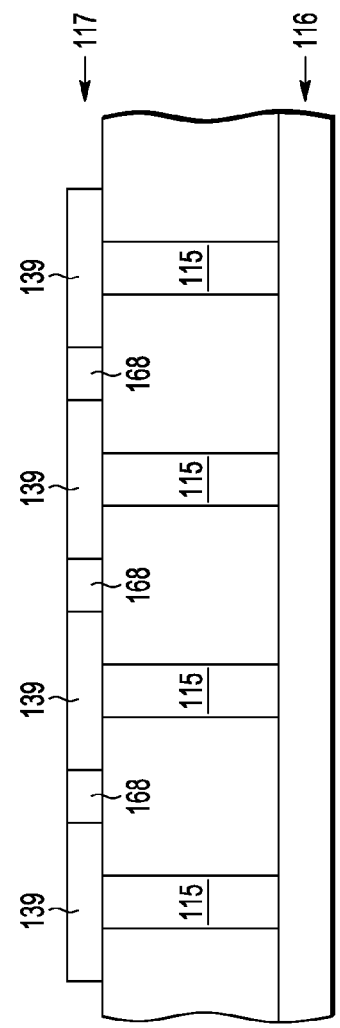
FIG. 14 is a cross-sectional view of the electromagnetic bandgap unit cells including the patches illustrated at FIG. 13 in accordance with a specific embodiment of the present disclosure.

A second type of EBG unit cell is referred to herein as a lossy EBG unit cell that is used in combination with other lossy EBG unit cells to form a metamaterial referred herein as a lossy EBG structure, wherein a lossy EBG structure significantly absorbs the power in TE modes over a desired frequency range. For example, a lossy EBG structure as described herein can absorb the power in a TE mode of the integrated antenna package disclosed herein for a 77 GHz signal propagating over and under the die 120 by at least 3 dB per EBG unit cell, such as 5 dB per EBG unit cell, while a lossless EBG structure as described herein will absorb substantially none of the power in a TE mode of the integrated antenna package over the slot resonator. Instead, the TE modes excited by the slot resonator are reactively attenuated, as opposed to absorbed, by a lossless EBG structure, such that the reactive E-fields and H-fields at a given point fail to propagate because they are 90 degrees out of phase. FIG. 13 illustrates, in layout and schematic form, one example of a lossy EBG structure in accordance with a specific embodiment, wherein the patches 139 of lossy EBG unit cells are electrically connected to patches 139 of adjacent EBG unit cells by an effective resistance 190 (illustrated schematically) that is less than the effective resistance between adjacent patches of a lossless EBG structure. For example, the effective resistance 190 can be at least an order of magnitude less, two orders of magnitude less, or three orders of magnitude less than the effective resistance between adjacent patches of a lossless EBG patches. In one embodiment, the effective resistance 190 is 175 Ohms. In a particular embodiment illustrated at FIG. 14, the effective resistance 180 between patches is defined by filling the gap that forms a grid between adjacent EBG unit cells with a resistive material, such as a doped poly-silicon having a sheet resistance of 1 KOhms/square, while the sheet resistance of a material between patches of a lossless EBG cell are significantly greater, such as at least 10, 100, or 1000 time greater. Portions 168 of such a resistive layer are illustrated between the patches 139 at the cross sectional view of FIG. 14. The physical structure associated with an intentional resistor formed between patches of a lossy EBG structure is absent in a lossless EBG structure.

Figure 15:
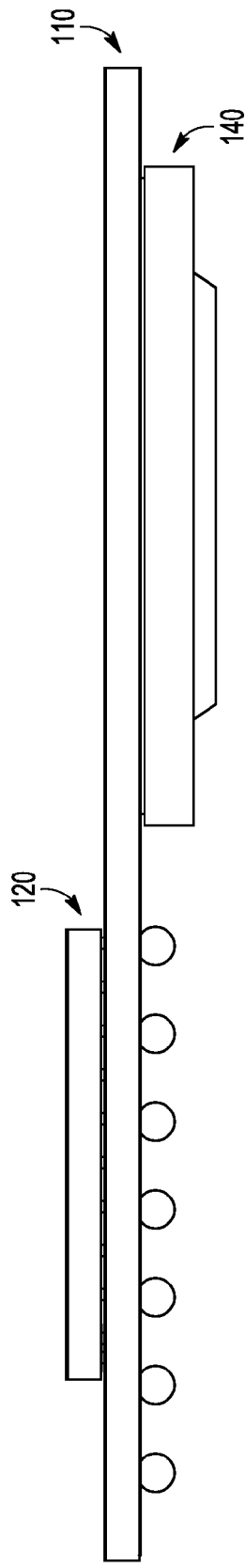
FIG. 15 is a side view of the portion of integrated package of FIG. 2 further including a die mounted on the interposer in accordance with a specific embodiment of the present disclosure.

FIG. 15 illustrates the cross-sectional view of FIG. 2 with the addition of the die 120 attached to the interposer 110. The die 120 can be an RF receiver chip that includes active and passive electrical components that during operation demodulate an RF signal received at the microstrip feedline 165 to provide information, such as base-band information, to other control devices. Die 120 can alternatively be an RF transmitter chip that during operation modulates information, such as base-band information, onto an RF signal to be provided to the microstrip feedline 165. Alternatively, die 120 can be an RF transceiver chip that both receives and transmits RF signals as indicated above. In operation, the active structures of the die 120 include an RF amplifier (not shown) used to amplify a millimeter wavelength signal, such as a 77 GHz signal, that is either being received or transmitted. The die 120 can have an edge seal that includes one or more ground rings along the outer periphery of the active side (not shown), which is the side of the die closest to the interposer, that are connected to a grounded backside by TSVs with a period dimension equal to or less than the wavelength of a desired frequency.

Figure 16:
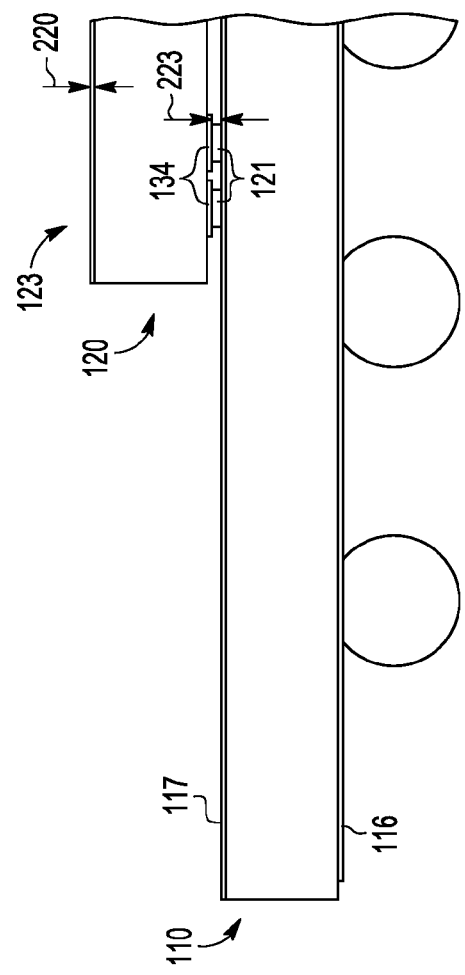
FIG. 16 illustrates a side view of a portion of the die and interposer of FIG. 2 in accordance with a specific embodiment of the present disclosure.

FIG. 16 illustrates a portion of the die 120 and interposer 110 of FIG. 15 in greater detail. At FIG. 16, the die 120 is illustrated to include a conductive layer 123 over the back side of the die substrate, die bond pads 134, and stud bump interconnects 121. The conductive layer 123 can include gold having a thickness of dimension 220. The stud bumps 121 are connected to the die bond pads 134 and to the interposer bond pads 134 (FIG. 9). A space of dimension 223 is defined between the metal layer of the die that includes die pads 134 and the conductive layer 117 of the interposer. Stud bump interconnects 121 can include copper. Signals including data information and reference voltages, such as ground, are communicated between the die 120 and interposer 110 through the stud bump interconnects 121.

Figure 17:
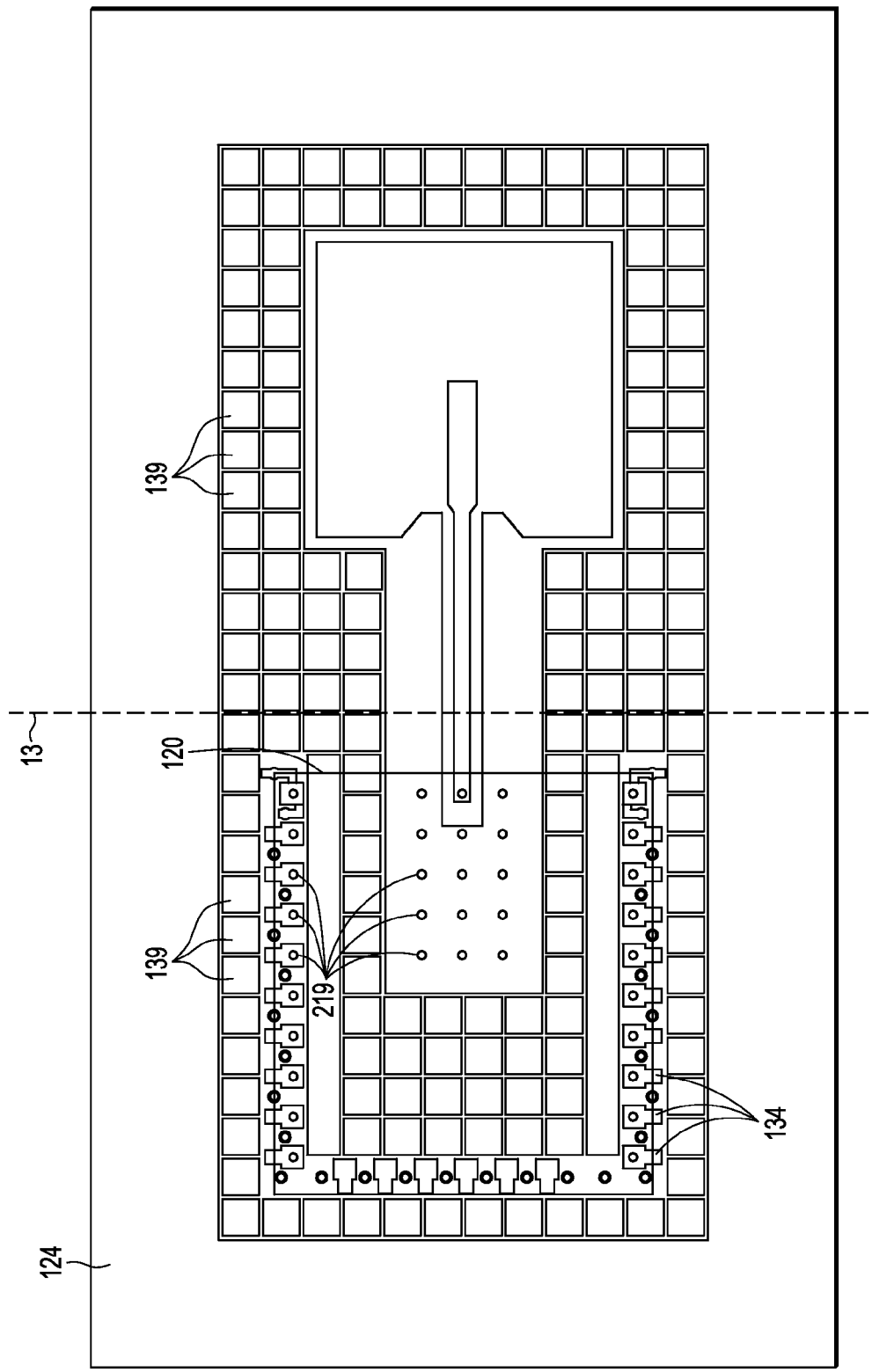
FIG. 17 illustrates the plan view of FIG. 9 and the relative location of the die and die interconnects in accordance with a specific embodiment of the present disclosure.

In operation, the circuitry and interconnects of the die 120 can emit an undesirable radio signal, e.g., operate as an RF noise source that transmit signals in response to RF currents flowing through them. When enclosed in a shielded package of the type described, this can result in undesirable TE modes over a broad range of frequencies that can couple to the CPW at interposer 110. To reduce the affects of undesirable TE modes generated by the die 120, the EBG unit cells under the die 120, and the first full EBG unit cell adjacent to the die 120 are defined to be lossy EBG cells. Referring to FIG. 17, the patches 139 to the left of indicator line 13 are associated with lossy EBG unit cells that can be of the type illustrated at FIG. 14. The remaining EBG unit cells (to the right of indicator line 13 of FIG. 17) are associated with lossless EBG cells. For a the 77 GHz device described herein, for example, the power in TE modes associated with a broad range of frequencies, such as from 60 GHz to 130 GHz, or from 65 GHz to 120 GHz can be absorbed.

Figure 18:
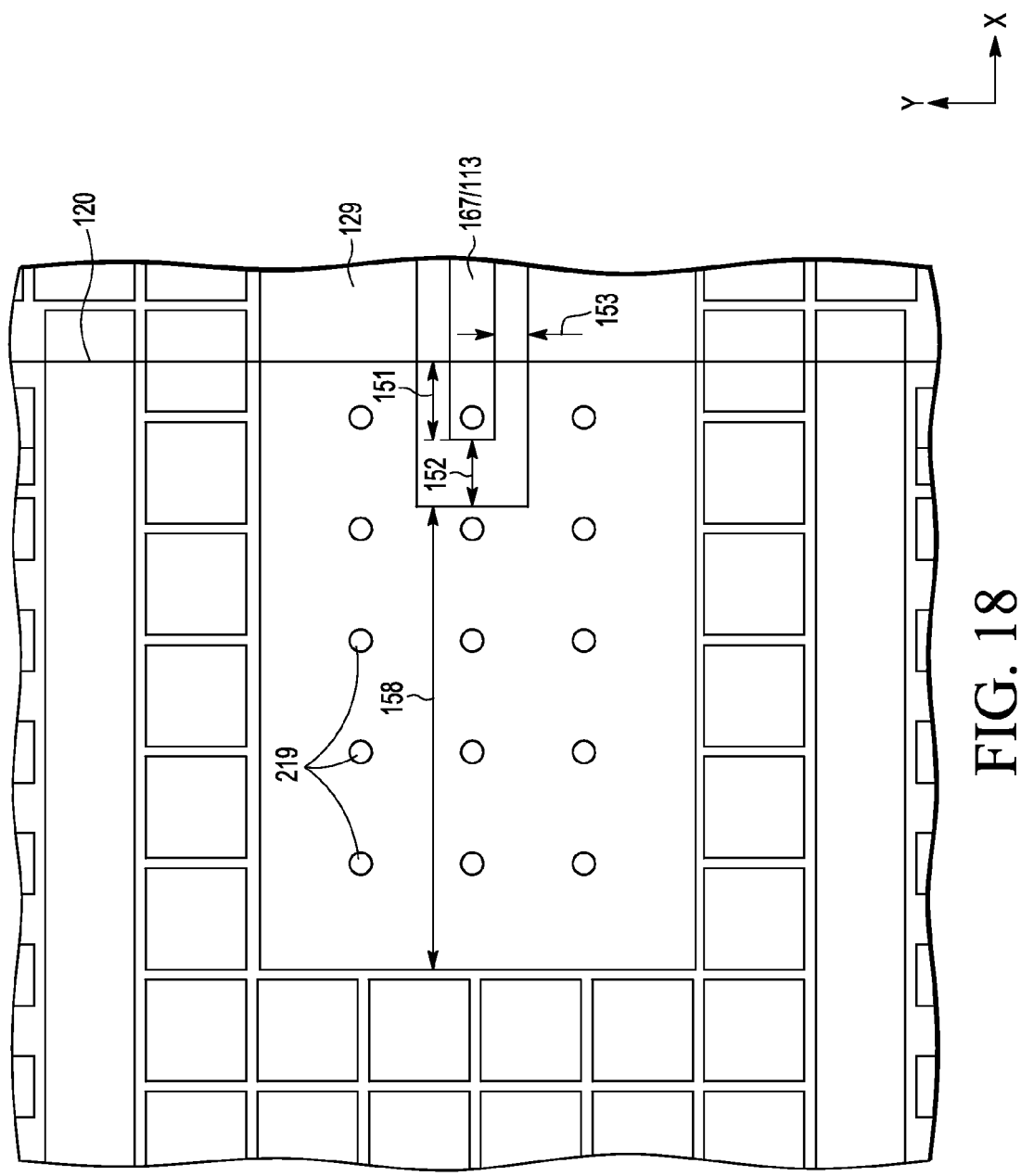
FIG. 18 is a plan view that illustrates a portion of the plan view of FIG. 18 in greater detail in accordance with a specific embodiment of the present disclosure.

FIG. 17 illustrates a top view of the assembly of FIG. 15 to illustrate the relative location of the die 120 and its stud bump interconnects 219 to the interposer 110. FIG. 18 illustrates a portion of FIG. 17 in greater detail near the CPW portion of conductive layer 117. In particular, the distance from the left edge of the conductive layer 129 to the left edge of the gap surrounding conductive portion 167 of the CPW is dimension 158. The distance between conductive portion 167 and the conductive layer 129 in the x-directions is dimension 152. The distance in the y-direction between the conductive portion 167 and the conductive layer 129 is dimension 153. The distance between the left-most edge of the CPW portion of the conductive structure 167 and the right-most edge of the die 120 is dimension 151.

Figure 19:
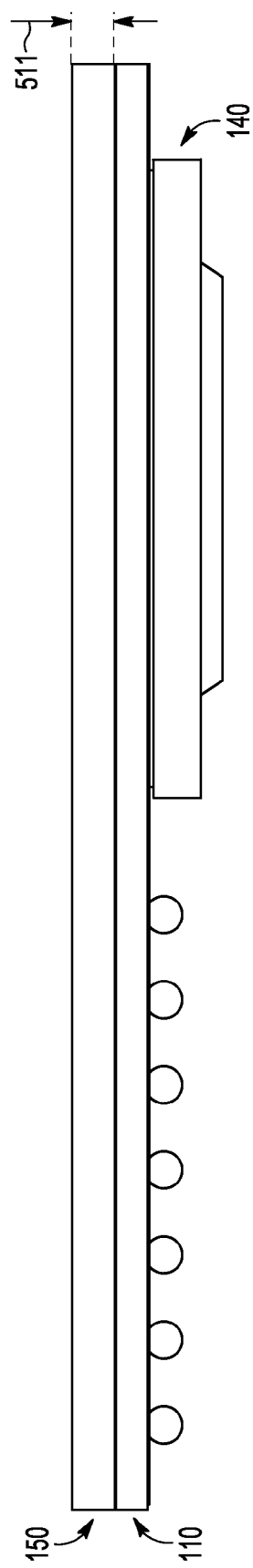
FIG. 19 is a side view of a portion of the integrated package of FIG. 15 including a ring structure in accordance with a particular embodiment of the present disclosure.
Figure 20:
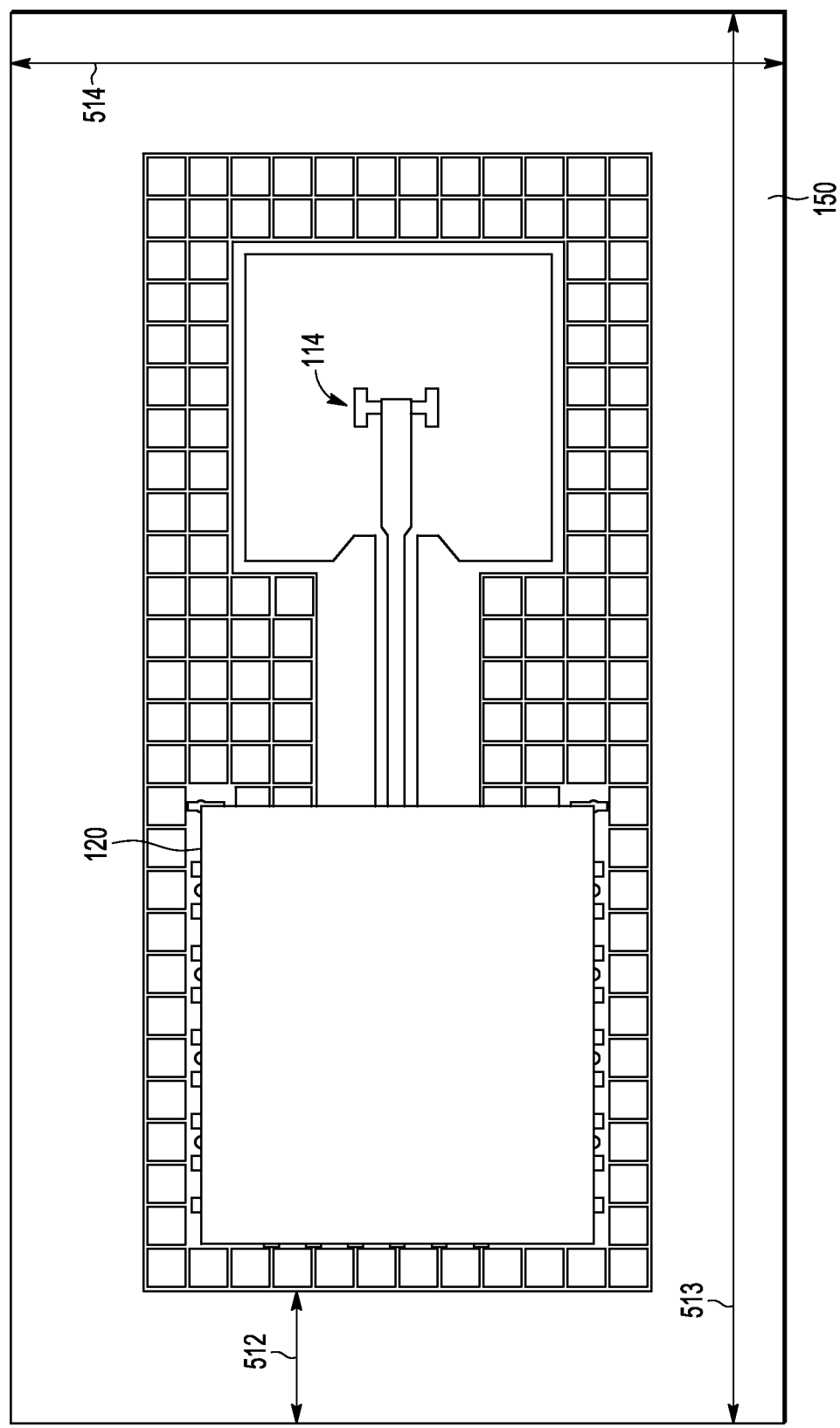
FIG. 20 is a plan view of FIG. 9 including the die of FIG. 15 and the ring structure of FIG. 19 in accordance with a specific embodiment of the present disclosure.

FIG. 19 illustrates the cross-sectional view of FIG. 17 with the addition of the conductive spacer 150 to the interposer 110. The spacer 150 has a height of dimension 511, and is connected to the interposer 110 by a conductive adhesive layer 521 (FIG. 22). The spacer 150 includes a conductive material electrically connecting to the conductive ring 124 of the substrate interposer 110. In one embodiment, the spacer 150 includes conductive outer layer, such as a metal layer, surrounding a less conductive central portion. FIG. 20 illustrates a plan view of the assembly of FIG. 19 to illustrate the relative locations of spacer 150, die 120, interposer 110, and slot resonator 114. The spacer 150 has an annular shape with a dimension 512 from its inside edge to its outside edge, an overall x-dimension 513, and an overall y-dimension 514.

FIG. 21 illustrates the same cross-sectional view as FIG. 19 with the addition of the cap 130. The cap 130 has an x-dimension 301, a thickness dimension 302, and is connected to the spacer 150 by a conductive adhesive layer 522 (FIG. 22). FIG. 22 illustrates a portion of FIG. 21 including the ball-type interconnects 160, the interposer 110, the spacer 150, the cap 130 and the conductive adhesive layers 521 and 522, which can be epoxy layers having a resistivity of 0.02 Ohms-cm and a thickness dimension 523.

Figure 23:
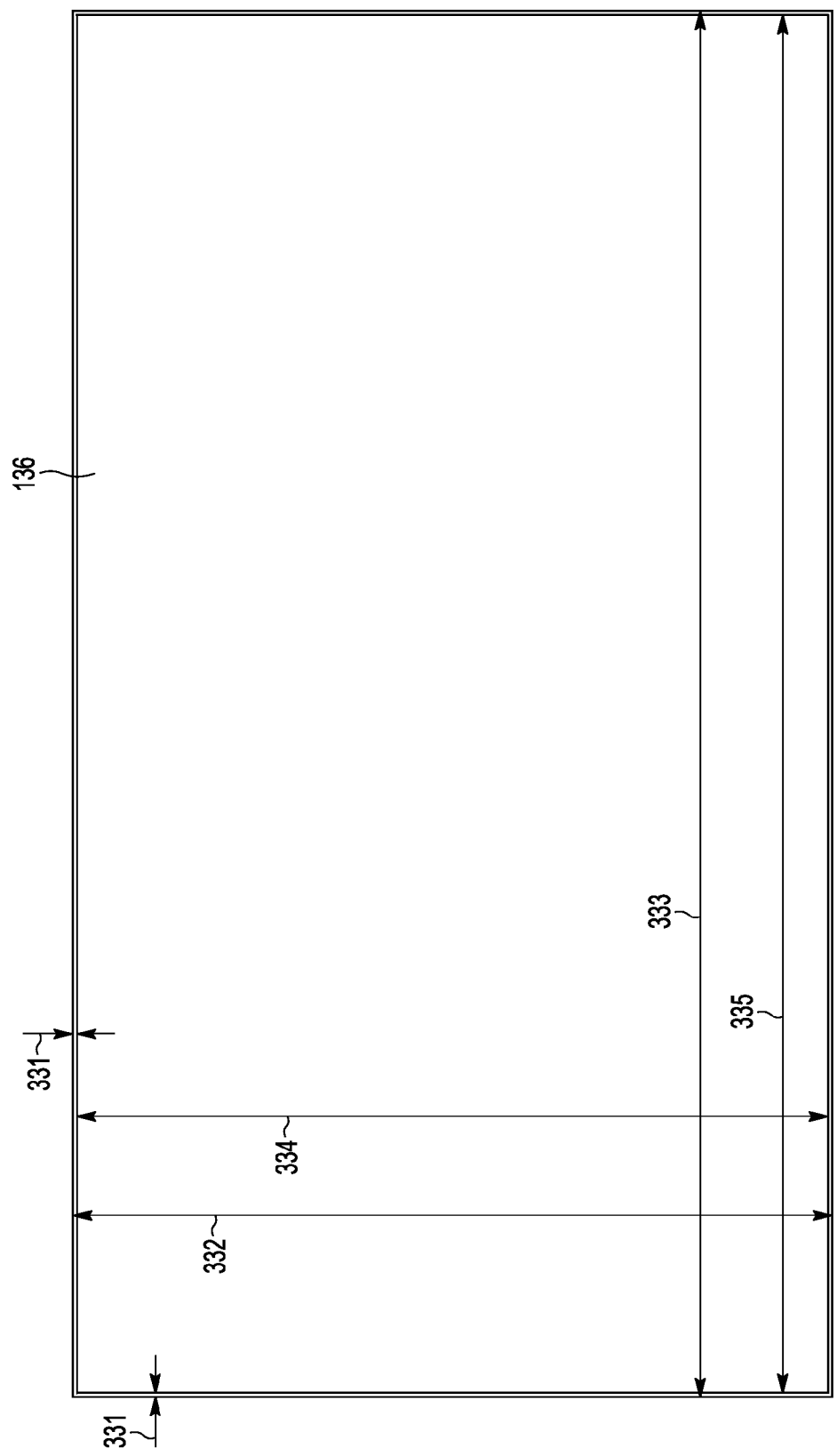
FIG. 23 is a plan view of the integrated antenna device of FIG. 21 illustrating an outer portion of the cap in accordance with a specific embodiment of the present disclosure.

FIG. 23 illustrates the cap 130 including the outer conductive layer 136 as a solid ground plane that is offset from the edge of the silicon substrate of the cap 130 by dimension 331. The cap 130 has an overall x-dimension 333 and an overall y-dimension 332. The outer conductive layer 136 has an x-dimension 335 and y-dimension 334.

Figure 24:
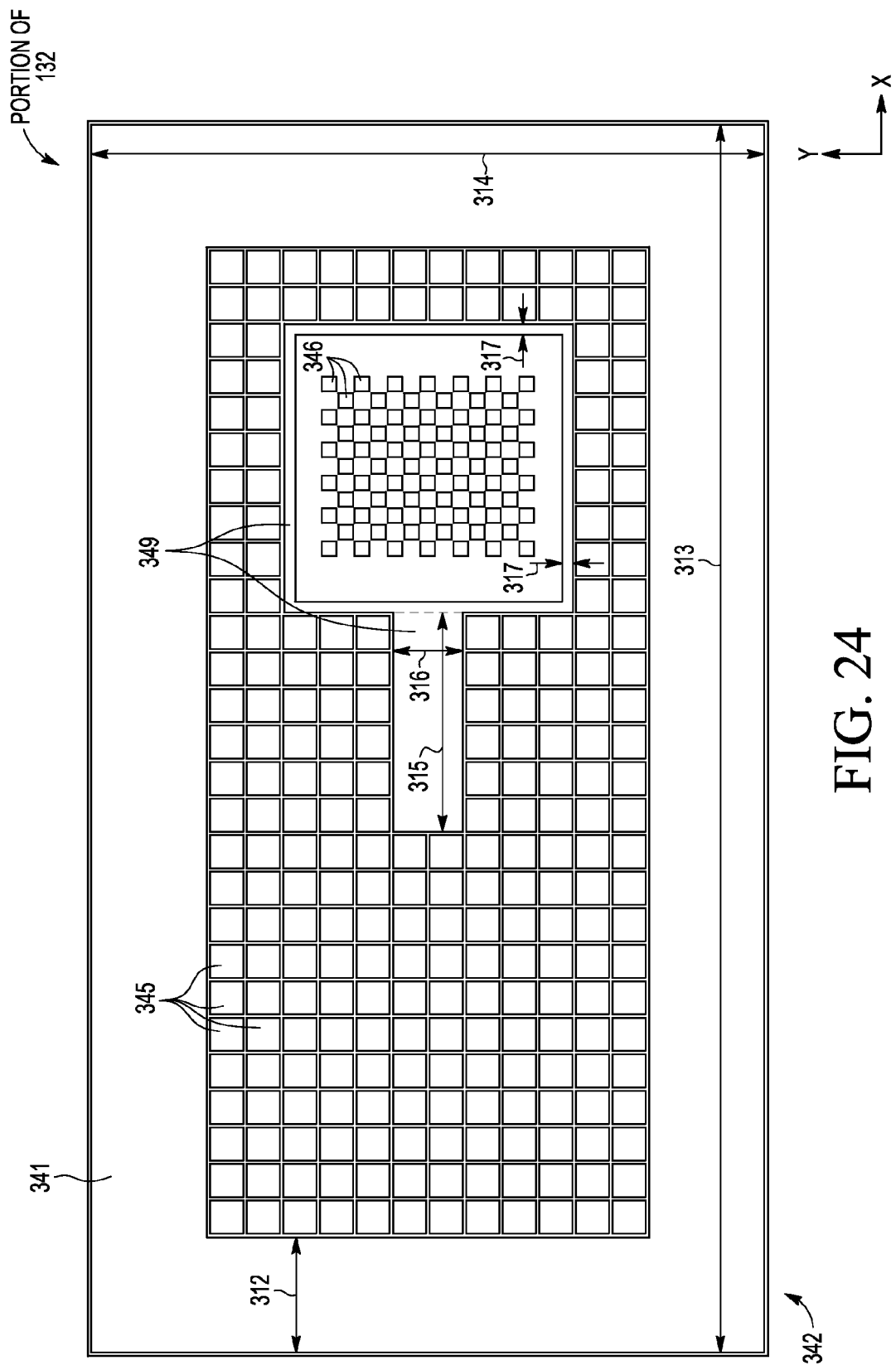
FIG. 24 is a plan view of a first conductive layer of an inner portion of the cap of the integrated antenna device in accordance with a specific embodiment of the present disclosure.

FIG. 24 illustrates a conductive layer 342 that is one of two coplanar conducive layers separated by a dielectric that define the inner conductive layer 137. Each of the two conductive layers 342 and 343 (FIG. 27) can be gold having a thickness dimension 11, separated by the thickness of the dielectric layer having dimension 13. The conductive layer 342 is the layer closest the silicon substrate of the cap 130 that includes patches 346, and the second conductive layer, illustrated at FIG. 27, includes patches 356 that overly the conductive layer 342.

Illustrated at FIG. 24 are various portions of conductive layer 342 including conductive ring 341, patches 345, patches 346, and conductive structure 349. The conductive ring 341 has an annular shape with a dimension 312 from its inside edge to its outside edge, an overall x-dimension 313, and an overall y-dimension 314. Patches 345 are square patches having the same dimensions and spacing as patches 139 as previously described. A left portion of conductive structure 349 has y-dimension 316 and x-dimension 315. A ring portion of the conductive structure 349 has thickness of y-dimension 317 and a thickness of x-dimension 317. Each of the conductive ring 341, conductive structure 349, patches 345, and patches 346 are connected to corresponding TSVs 135 as discussed in greater detail with reference to FIG. 25.

Figure 25:
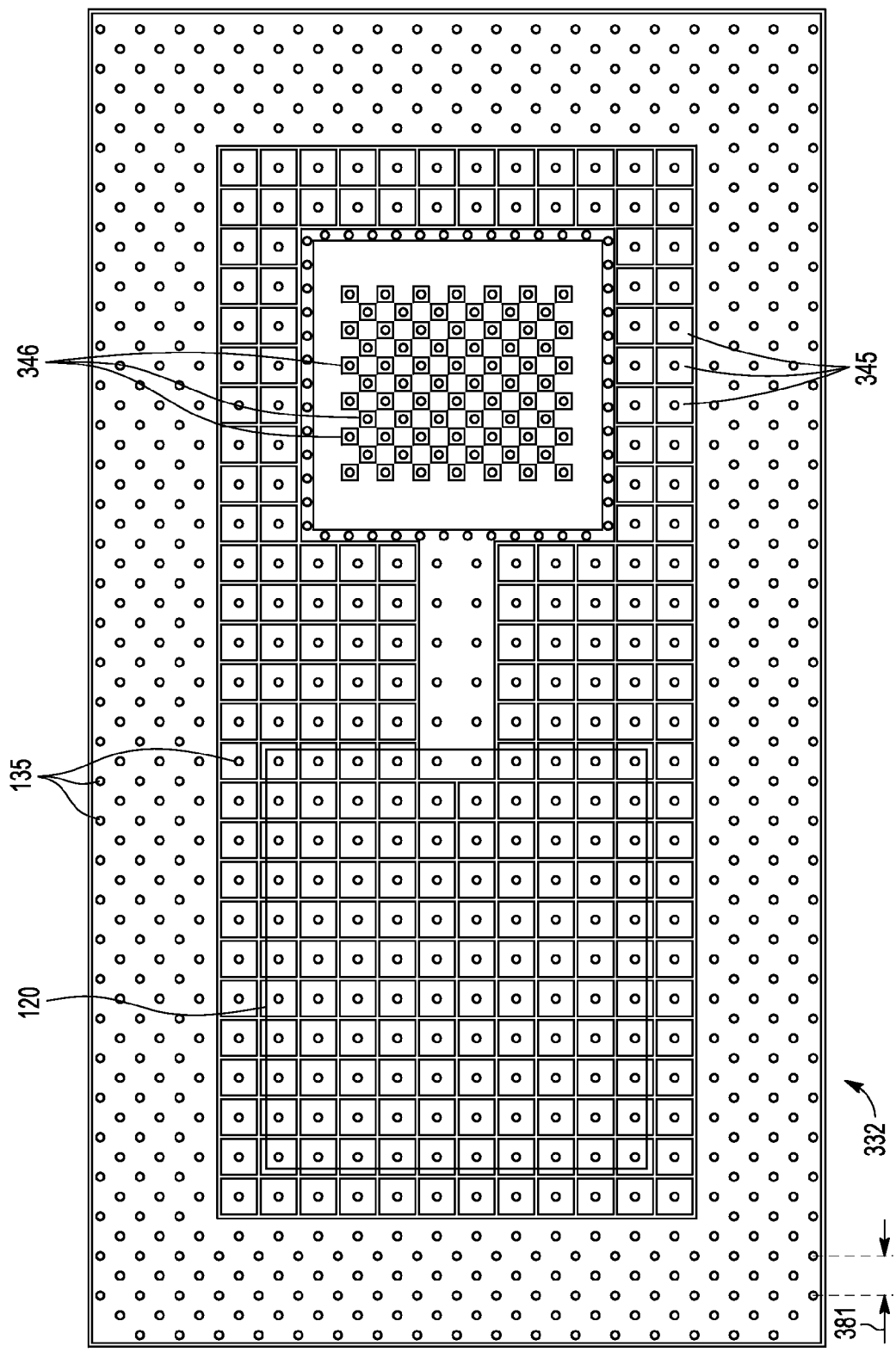
FIG. 25 is the plan view of FIG. 24 further illustrating the location of underlying die 120 and through-substrate vias in accordance with a specific embodiment of the present disclosure.

FIG. 25 illustrates a plan view of FIG. 24 indicating locations where TSVs 135 contact conductive layer 342 of layer 137, and the relative location of the die 120. As illustrated, six concentric rings of TSVs 135 are formed near the periphery of the layer 342. Each concentric ring of TSVs is offset from its adjacent concentric TSV rings to form a triangular lattice structure. The period of the TSVs within each row is dimension 381. The diameter of the TSVs 135 where they connect to conductive layer 137 is dimension 382 (not shown). It will be appreciated that each one of the patches 345 and 346 is connected to the ground plane 136 at the opposing side of the cap 130 by a corresponding TSV 135. Each combination of a patch 345, TSV 135, and ground plane 136 defines an EBG unit cell as described above. In a particular implementation, the EBG unit cells illustrated as being within, or partially within the periphery location of die 120, and unit cells adjacent to the location of die 120 are lossy EBG unit cells as described above, and therefore will significantly suppress TE modes over the die 120. Each of the other EBG unit cells associated with patches 346 are lossless EBG unit cells, and therefore, will not significantly absorb TE modes. Similarly, each combination of a patch 346, TSV 135, and ground plane 316 defines a portion of a lossless EBG unit cell that also is associated with a plurality of patches at an overlying conductive layer 343 as described at FIG. 27.

Figure 26:
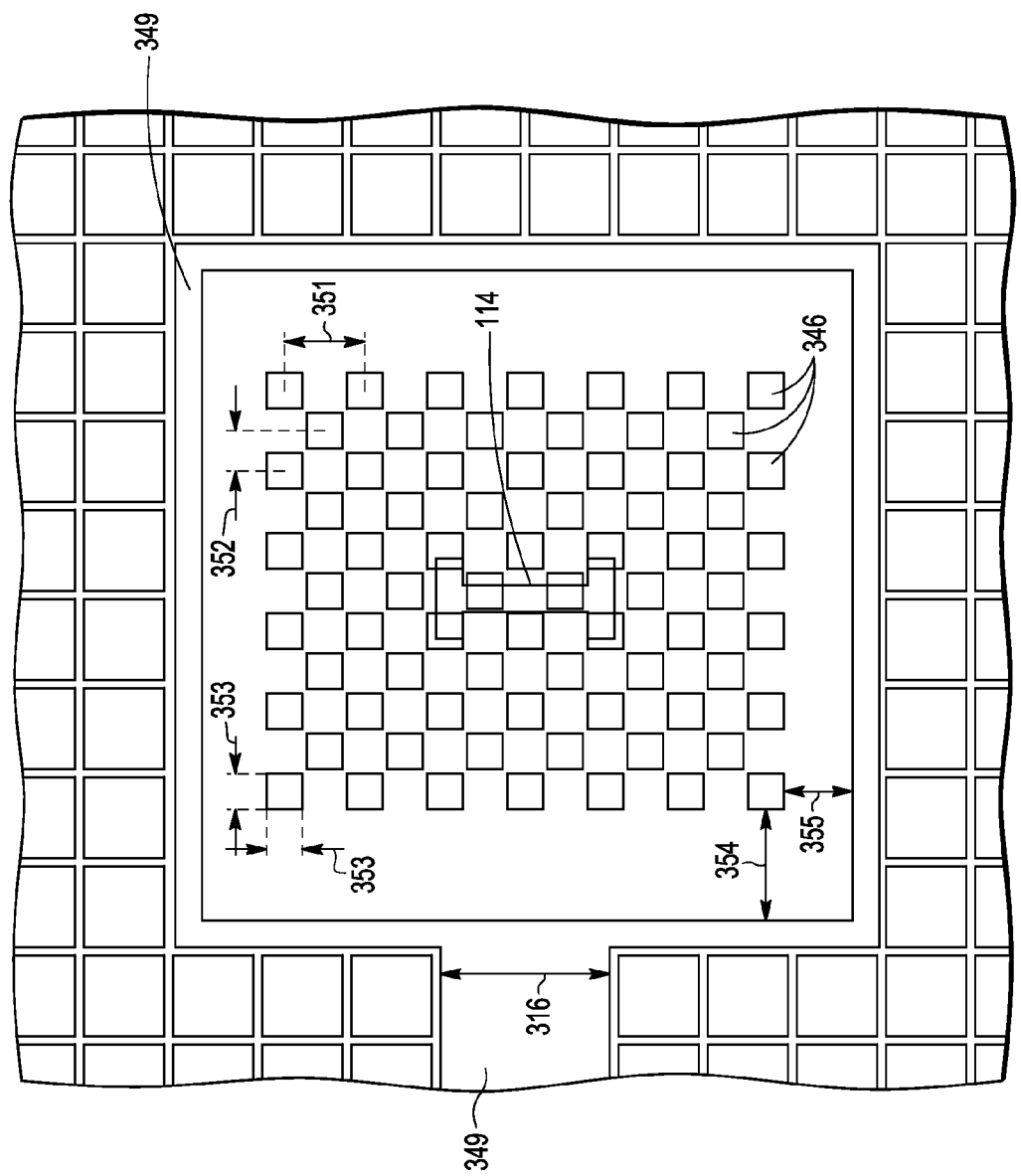
FIG. 26 is a plan view of portion of the integrated antenna package of FIG. 25 in greater detail in accordance with a specific embodiment of the present disclosure

As illustrated at FIG. 26, the patches 346 are aligned in offset rows and columns, with patches in a common row have a period dimension 351, and the distance between rows and columns of patches 346 being a period dimension 352. Each of the patches 346 has an x-dimension 353 and y-dimension 353. The left-most and right-most column of patches 346 are offset from the ring portion of the conductive structure 349 by dimension 354. The top-most and bottom-most rows of patches 346 are offset from the ring portion of the conductive structure 349 by dimension 355.

Figure 27:
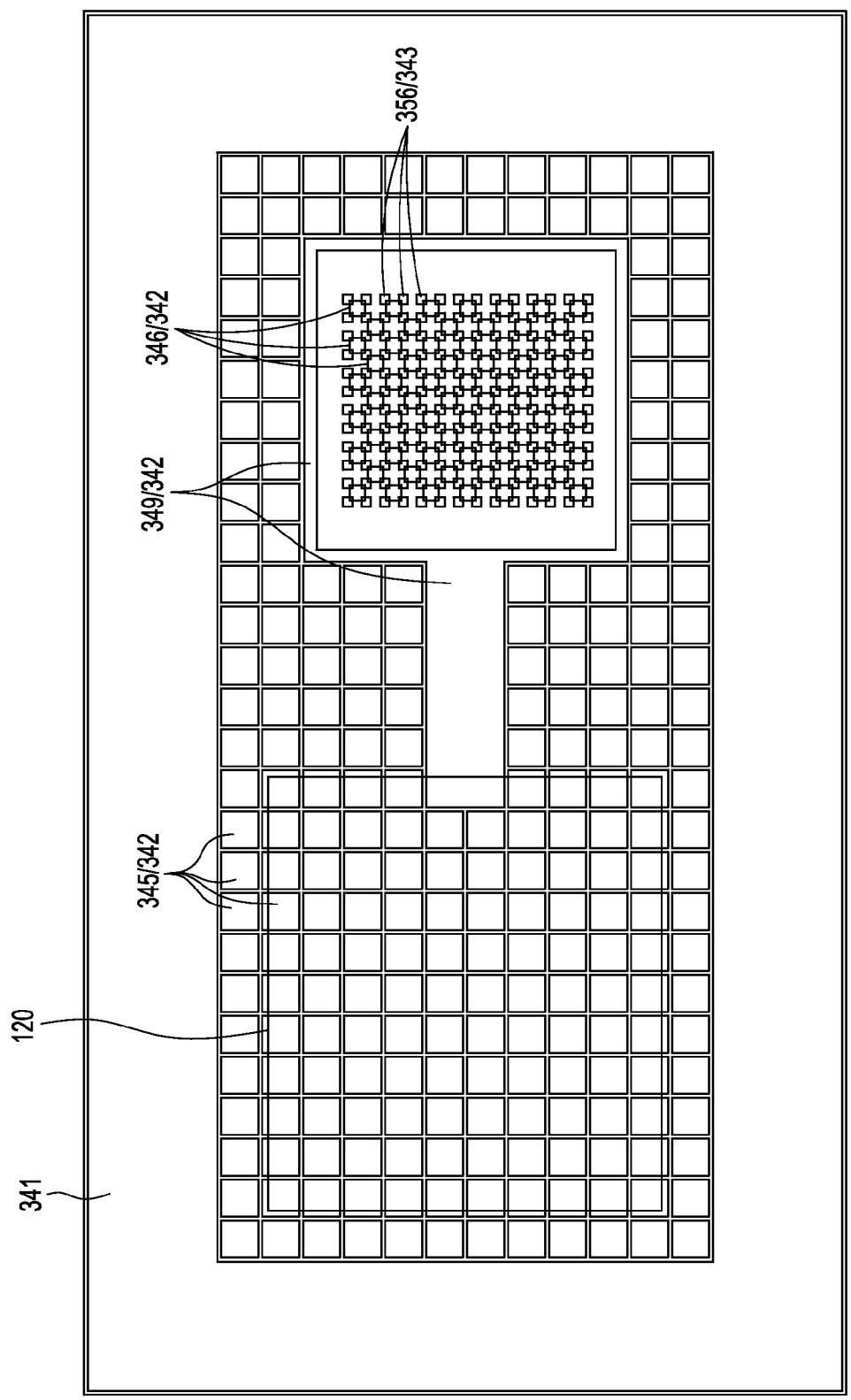
FIG. 27 is a plan view of the integrated package antenna of FIG. 25 further illustrated the location of conductive patches at a second conductive layer of the cap in accordance with a specific embodiment of the present disclosure.
Figure 28:
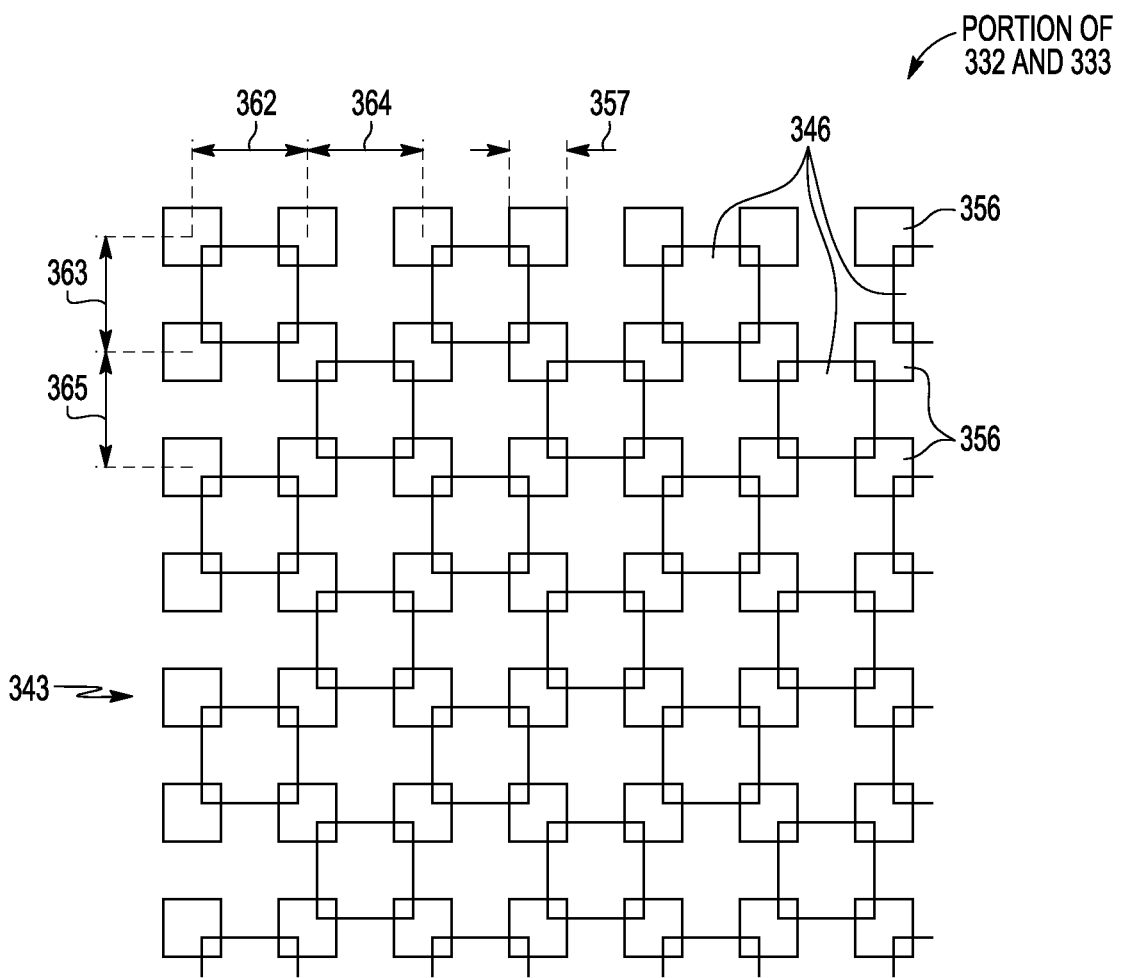
FIG. 28 is a plan view of a portion of the integrated antenna package of FIG. 27 in greater detail in accordance with a specific embodiment of the present disclosure.

FIG. 27 illustrates the first conductive layer 342, as in FIG. 24, and the second conductive layer 343 that overlies the first conductive layer, such that the first conductive layer 342 is between the second conductive layer 343 and the substrate of the cap structure 130. In one embodiment, the second conductive layer includes a plurality of patches 356 aligned in rows and columns to form a grid pattern that are separated from patches 346 by a dielectric layer, and as illustrated overlap the patches 346. In particular, four patches 356 of the second conductive layer 343 overlap corresponding corner portions of each patch 346 of the first conductive layer 342. The patches 356 of the second conductive layer 343 are electrically isolated from each other, and therefore are not connected to vias 135. As illustrated at FIG. 28, each patch 356 is square having a side dimension 357, the center-to-center spacing of adjacent patches 356 that overly a common patch 346 is x-dimension 362 and y-dimension 363. Each combination of a patch 346, its four overlying patches 346 (which are shared with other patches 346), a TSV 135, and ground plane 136 form a lossless EBG unit cell that has multiple layers of patches.

Figure 29:
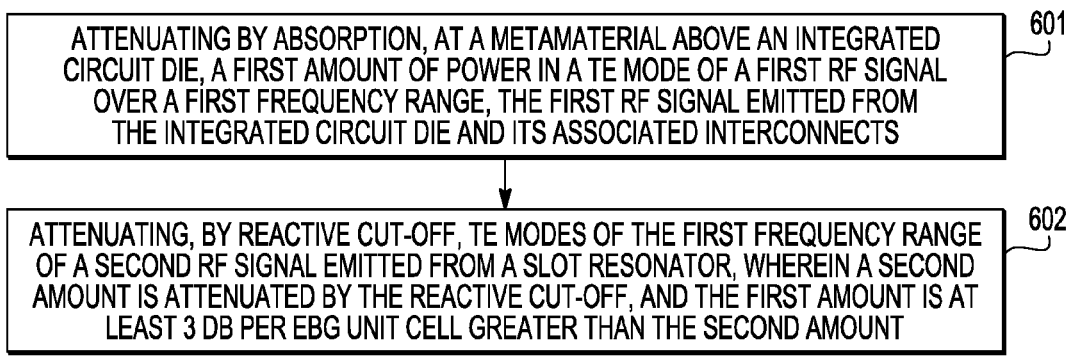
FIG. 29 is a flow diagram of a method in accordance with a specific embodiment of the present disclosure.

FIG. 29 illustrates a flow diagram of a method in accordance with a specific embodiment of the present disclosure. At node 601, power in TE modes over a first frequency range of an RF signal radiated from an integrated circuit die is absorbed by a metamaterial above the integrated circuit die. In one embodiment the metamaterial is the disclosed lossy EBG structure at location 131 of the cap 130, as illustrated at FIG. 1, and the signal being absorbed is propagating over die 120, and in a direction parallel to a major surface of the die 120. In one embodiment, TE modes in a frequency range equal to at least plus or minus a desired bandwidth either side of a desired center frequency is absorbed by at least 3 dB per EBG unit cell, such as 5 dB per EBG unit cell. For example, for an integrated antenna package having a desired signal with a center frequency of 77 GHz, the power in TE modes over a frequency range from 60 GHz to 130 GHz, or from 74 GHz to 83 GHz is attenuated by at least 3 dB per unit cell by the lossy EBG structure overlying the integrated circuit die.

At node 602, power in a TE mode of the frequency range of an RF signal emitted from a slot resonator is reactively attenuated, but not absorbed, by a metamaterial above the microstrip feedline, wherein the electromagnetic fields being reactively attenuated are propagating away from the slot resonator in all radial directions. In one embodiment the metamaterial is the disclosed lossless EBG structure at location 132 of the cap 130, as illustrated at FIG. 1. In one embodiment, the metamaterial above the microstrip feedline reactively attenuates TE modes, but does not absorb the TE modes, in a frequency range equal to at least plus or minus a desired bandwidth either side of a desired center frequency. For example, for an integrated antenna package having a desired signal with a center frequency of 77 GHz, power in TE modes in a frequency range from 74 GHz to 80 GHz is substantially not absorbed, but is reactively attenuated. Therefore, the fields in the TE modes decay with radial distance from the slot but substantially no power is transferred or absorbed by the lossless EBG structure at location 132 over the microstrip. Note that the attenuation of TE modes due to reactive attenuation by the lossless EBG structure occurs over a narrower bandwidth than the attenuation of the TE modes due to absorption by the lossy EBG structure.

Figure 30:
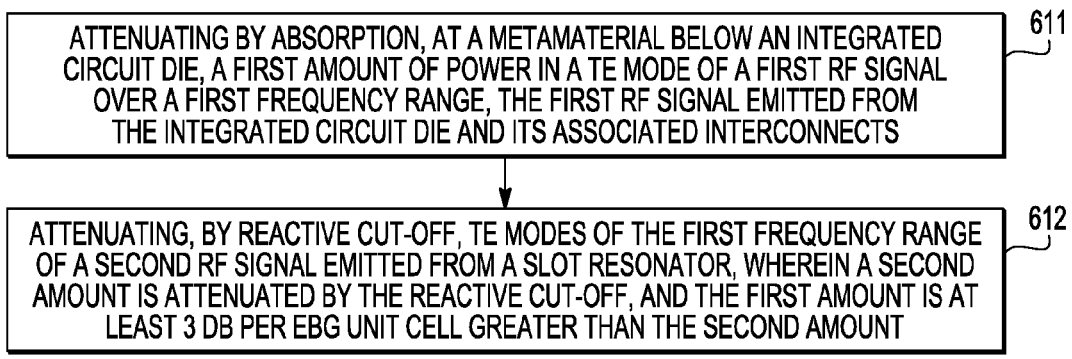
FIG. 30 is a flow diagram of a method in accordance with a specific embodiment of the present disclosure.

FIG. 30 illustrates a flow diagram of a method in accordance with a specific embodiment of the present disclosure. At node 611, power in TE modes over a first frequency range of an RF signal radiated from an integrated circuit die is absorbed by a metamaterial below the integrated circuit die. In one embodiment the metamaterial is the lossy EBG structure at location 111 of the interposer 110, as illustrated at FIG. 1, and the signal being absorbed is propagating under die 120, and in a direction parallel to a major surface of the die 120. In one embodiment, power in TE modes in a frequency range equal to at least plus or minus a desired bandwidth either side of a desired center frequency is absorbed by at least 3 dB per EBG unit cell, such as 5 dB per EBG unit cell. For example, for an integrated antenna package having a desired signal with a center frequency of 77 GHz, the power in TE modes over a frequency range from 60 GHz to 130 GHz, or from 74 GHz to 80 GHz is attenuated by at least 3 dB per unit cell by the lossy EBG structure overlying the integrated circuit die.

At node 612, power in a TE mode of the frequency range of an RF signal emitted from a slot resonator is reactively attenuated, but not absorbed, by a metamaterial above the microstrip feedline. The signal being reactively attenuated is propagating away from the slot resonator in all radial directions. In one embodiment the metamaterial is the lossless EBG structure at location 132 of the cap 130, as illustrated at FIG. 1. In one embodiment, the metamaterial above the microstrip feedline reactively attenuates TE modes, but does not absorb the TE modes, in a frequency range equal to at least plus or minus a desired bandwidth either side of a desired center frequency. For example, for an integrated antenna package having a desired signal with a center frequency of 77 GHz, power in TE modes over a frequency range from 74 GHz to 80 GHz is substantially not absorbed, but the TE mode fields are reactively attenuated. Note that the attenuation of power in TE modes due to reactive attenuation by the lossless EBG structure occurs over a narrower bandwidth than the attenuation of power in TE modes due to absorption by the lossy EBG structure.

Figure 31:
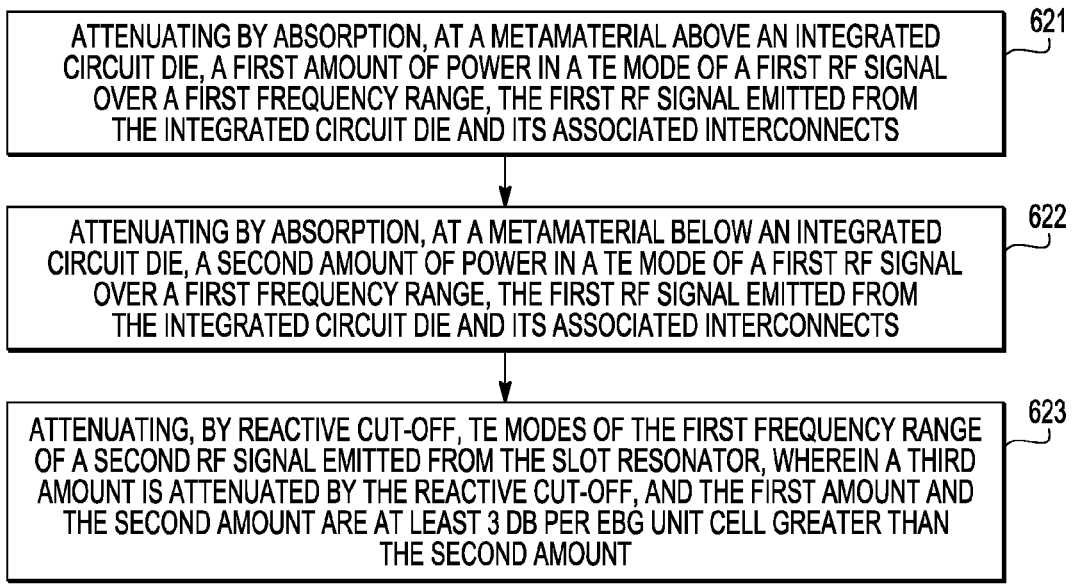
FIG. 31 is a flow diagram of a method in accordance with a specific embodiment of the present disclosure.

FIG. 31 illustrates a flow diagram of a method in accordance with a specific embodiment of the present disclosure that includes frequency selective surfaces over and under the die. A node 621, power in a TE mode of a first frequency range emitted from an integrated circuit is attenuated as described at node 601 of FIG. 29. At node 622, power in a TE mode of the first frequency range emitted from the integrated circuit dies is attenuated as described at node 611 of FIG. 30. At node 623 a TE mode of the first frequency range emitted from a slot resonator is attenuated as described at node 602 of FIG. 29.

Figure 32:
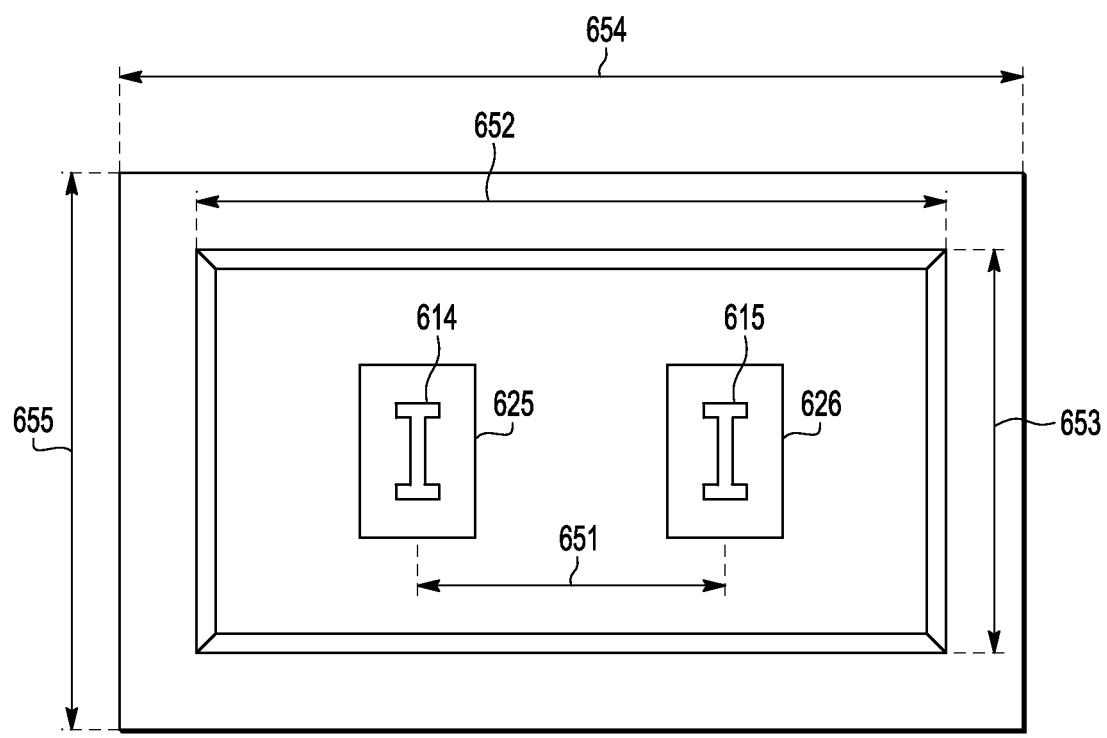
FIG. 32 is a plan view of an alternate embodiment of an antenna structure in accordance with a specific embodiment of the present disclosure.

FIG. 32 illustrates a plan view of an alternate antenna structure. The antenna structure of FIG. 32 has a length of dimension 654, a width of dimension 655, a cavity length of dimension 652, a cavity width of dimension 653, and includes two patch antennas, including patch 625 and 626. Each of the patches 625 and 626 has a corresponding slot resonator 614 and 615 at the outer conductive surface of the underlying interposer. Each of the slot resonators 614 and 615 are associated with corresponding microstrip feedlines (not illustrated) at the inner conductive surface of the interposer, and are connected to separate die contacts. Dimensions of the patches 625 and 626 can be the same as patch 143. Dimensions of the resonator slots 614 and 615 can be the same as slot resonator 114. During signal processing, such as for a radar system described below, a sum and difference pattern can be produced using information received from the two patch antenna receivers to provide more accurate angle measurements in a monopulse radar system. In an alternate embodiment, one of the two patch antennas can be associated with a transmitter and the other of the two patch antennas can be associated with a receiver implemented at the integrated antenna package.

| Reference Number | Measurement (um) |
|---|---|
| 11 | 5 |
| 12 | 30 |
| 13 | 2 |
| 102 | 150 |
| 104 | 850 |
| 111 | 150 |
| 125 | 640 |
| 126 | 640 |
| 151 | 180 |
| 152 | 120 |
| 153 | 70 |
| 158 | 1090 |
| 163 | 190 |
| 171 | 15 |
| 172 | 25 |
| 176 | 230 |
| 177 | 230 |
| 178 | 60 |
| 180 | 80 |
| 181 | 150 |
| 182 | 360 |
| 183 | 150 |
| 184 | 70 |
| 189 | 150 |
| 191 | 240 |
| 192 | 480 |
| 193 | 80 |
| 194 | 750 |
| 195 | 160 |
| 196 | 15 |
| 197 | 1820 |
| 198 | 1820 |
| 223 | 30 |
| 301 | 8150 |
| 302 | 150 |
| 312 | 650 |
| 313 | 8090 |
| 314 | 4340 |
| 315 | 1520 |
| 316 | 470 |
| 331 | 40 |
| 332 | 4410 |
| 333 | 8150 |
| 334 | 4340 |
| 335 | 8090 |
| 351 | 210 |
| 352 | 110 |
| 353 | 90 |
| 354 | 400 |
| 355 | 220 |
| 357 | 60 |
| 362 | 100 |
| 363 | 100 |
| 364 | 110 |
| 365 | 110 |
| 381 | 250 |
| 382 | 60 |
| 431 | 500 |
| 432 | 1000 |
| 441 | 200 |
| 442 | 120 |
| 443 | 320 |
| 446 | 1960 |
| 447 | 2170 |
| 448 | 2110 |
| 449 | 2250 |
| 451 | 30 |
| 456 | 1960 |
| 457 | 2170 |
| 458 | 2110 |
| 459 | 2250 |
| 460 | 175 |
| 461 | 130 |
| 462 | 130 |
| 463 | 150 |
| 464 | 20 |
| 465 | 20 |
| 466 | 30 |
| 467 | 60 |
| 477 | 60 |
| 511 | 150 |
| 512 | 640 |
| 513 | 8090 |
| 514 | 4340 |
| 523 | 30 |
| 651 | 2000 |
| 652 | 4500 |
| 653 | 2500 |
| 654 | 5500 |
| 655 | 3500 |

Figure 33:
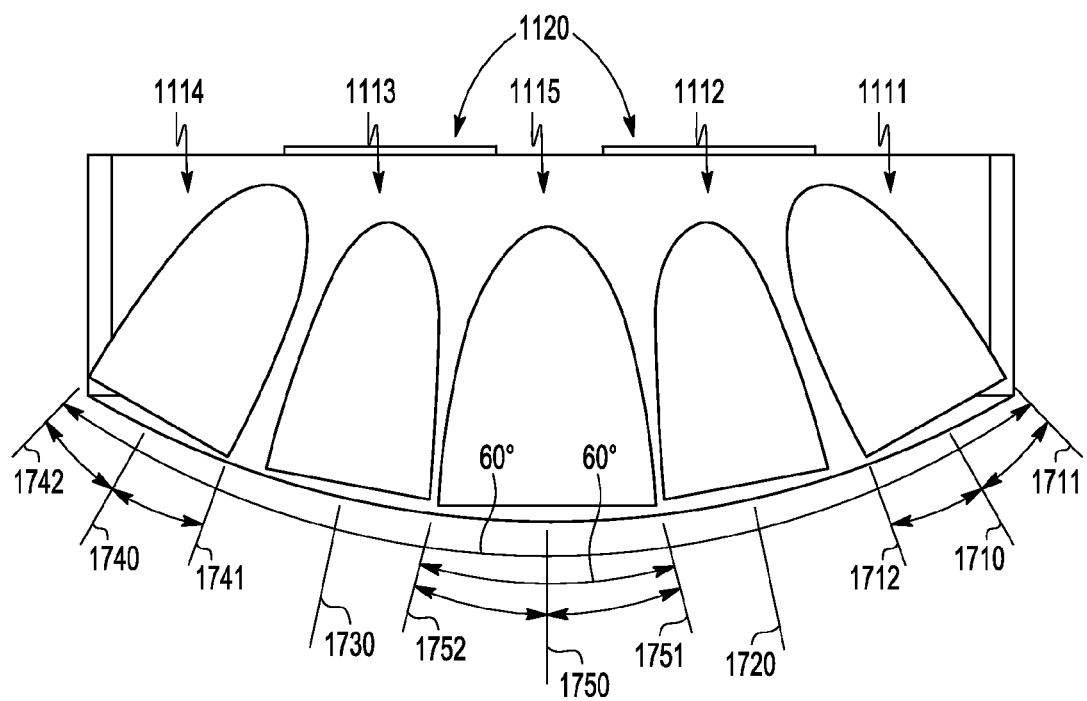
FIG. 33 illustrates a top view of a radar module in accordance with a specific embodiment of the present disclosure.

FIG. 33 illustrates a top view of a radar module 1100 mechanical package. Though not specifically illustrated, the mechanical package can be enclosed in an environmental package. In one embodiment, a reflected signal is received at one or more receive modules of the radar module 1100 and processed by control/processing circuitry to determine the location of any obstacles. The radar module 1100 can implement a mono-pulse radar system to reduce the likelihood of interference, and to facilitate simplified calibrations, as opposed to a phased array radar system. In one embodiment, a reflected signal is received at one or more receive modules of the radar module 1100 and processed by control/processing circuitry to determine the location of any obstacles. A car implementing the radar module 1100 can provide collision avoidance warnings, or implement collision avoidance actions, based upon the detected location of obstacles.

The radar module 1100 includes an external electrical interface 1120, which is illustrated to include multiple connectors, and a plurality locations associated with separate transmit and receive portions. Each of the separate transmit and receive portions is associated with one of the parabolic structures 1111-1115 illustrated at FIG. 33, which are aligned to face different directions relative to each other. In accordance with a particular embodiment, parabolic structures 1111-1114 are associated with corresponding RF receivers, and parabolic structure 1115 is associated with an RF transmitter. In the particular embodiment illustrated, the RF receivers 1111-1114 receive reflected radar signals, and do not have transmit capabilities. The RF transmitter 1115 transmits an RF signal to be reflected, and does not have receive capabilities.

Parabolic structure 1111 is aligned to face a direction indicated by midline 1710. Parabolic structure 1112 is aligned to face a direction indicated by midline 1720. Parabolic structure 1115 is aligned to face a direction indicated by midline 1750. Parabolic structure 1113 is aligned to face a direction indicated by midline 1730. Parabolic structure 1114 is aligned to face a direction indicated by midline 1740. The midline of the radar module 110 is the same as the midline for parabolic structure 1115. Parabolic structure 1111 faces a direction defined by its midline 1710 that is offset from the midline 1750 by an angle between 20 degrees and 35 degrees, such as 28 degrees. Parabolic structure 1111 has a total azimuth beam width defined by the angle between lines 1711 and 1712 between 20 degrees and 35 degrees, such as 28 degrees. Parabolic structure 1112 faces a direction defined by its midline 1720 that is offset from the midline 1750 by an angle of 15 degrees. Parabolic structure 1113 faces a direction defined by its midline 1730 that is offset from the midline 1750 by an angle of 15 degrees. Parabolic structure 1114 faces a direction defined by its midline 1740 that is offset from the midline 1750 by an angle of 30 degrees. Each of the receive structures 1111-1114 have the same azimuth beam width relative to their respective midlines that overlap the radiation pattern of adjacent parabolic structures. An effective total azimuth beam width of the receivers of the radar module 1100 between lines 1711 and 1742 is between 45 and 90 degrees, such as 60 degrees. The overlapping spread of azimuth beam widths between the parabolic structures 1111-1114, which are receive structures, and the azimuth beam width of the parabolic structure 1115, which is a transmit structure, provides the angular coverage available to the radar module. Relative the midline 1750, the parabolic structure 1115 and the parabolic structure 111-1114 have an azimuth beam width defined by the angle between lines 1751 and 1752, such as between 45 and 90 degrees. For example, such as 60 degrees.

In operation, the transmitter portion of the radar module 1100 that includes parabolic transmit structure 1115 transmits an RF radar signal at a desired frequency, such as 77 GHz. The transmitter portion can include an antenna structure, such as a single patch antenna or a dual patch antenna in an integrated antenna package (FIG. 1), that illuminates a second antenna or compound antenna, such as a reflector surface, a lens, the like, and combination thereof, which re-radiate the electromagnetic energy in the desired direction of potential obstacles to be avoided. The parabolic structure 1115 has a separate reflector surface to direct a transmitted radar signal that is independent of the reflector surfaces of the receiver portions 1111-1114 that direct a received radar signal after being received.

Figure 34:
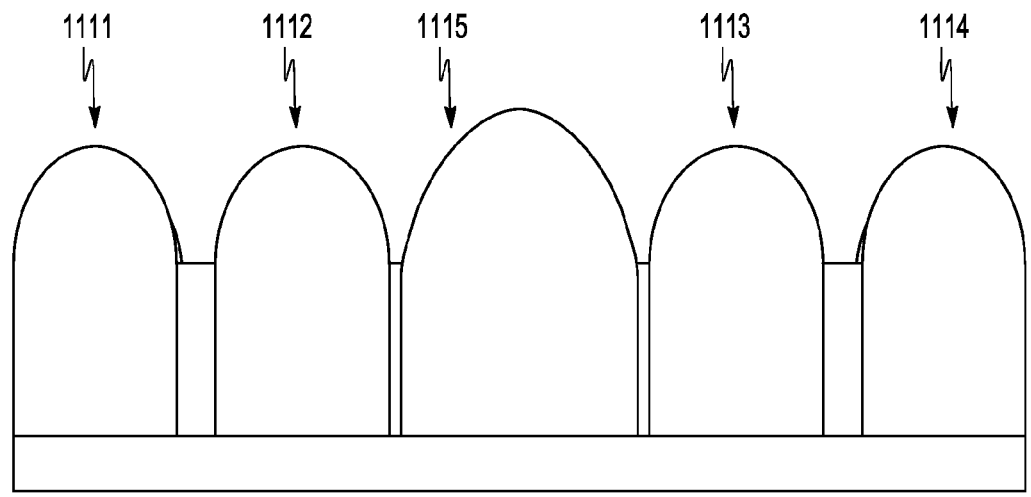
FIG. 34 illustrates a front view of a radar module in accordance with a specific embodiment of the present disclosure.

FIG. 34 illustrates a front view of the radar module 1100 of FIG. 33. In particular, FIG. 34 illustrates a respective front cover random with polarizing surface for each of the parabolic structures 1111-1115.

Figure 35:
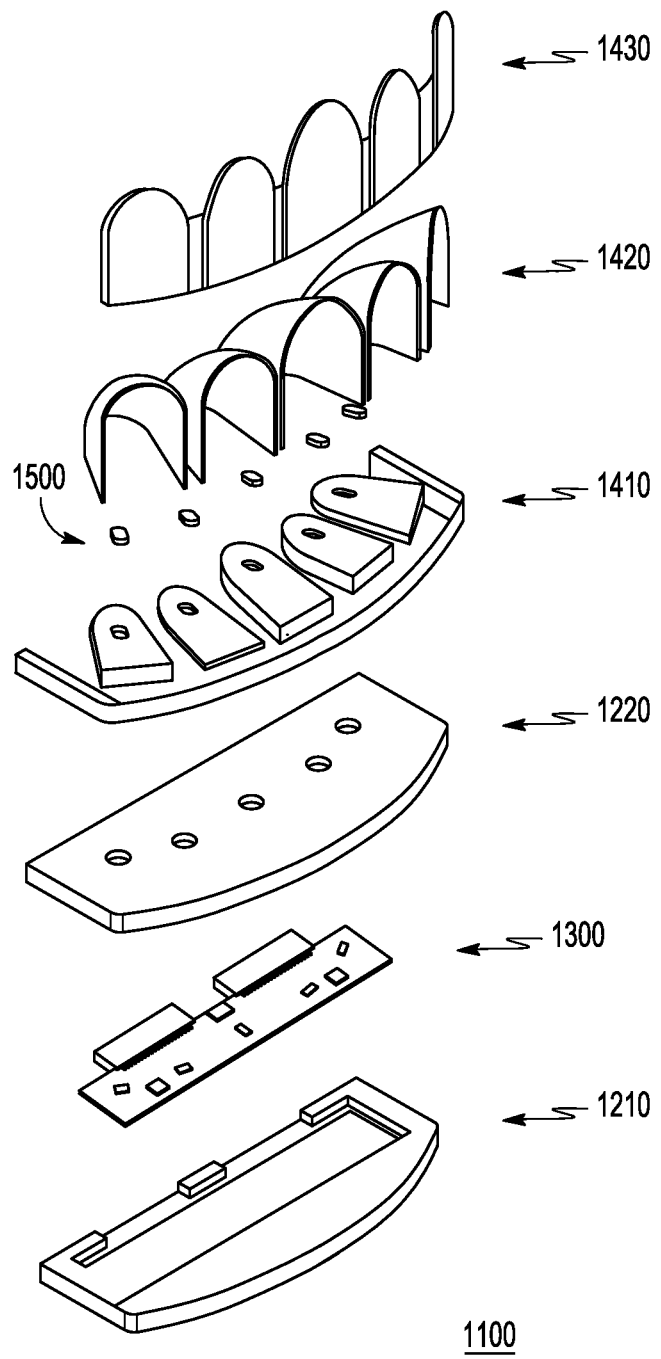
FIG. 35 illustrates an isometric view of various portions of the radar module of FIG. 1 in accordance with a specific embodiment of the present disclosure.

FIG. 35 illustrates an isometric view of various components of the radar module 1100 including a housing base 1210 and housing cover 1220, which receive and house an electronic assembly 1300. Overlying the housing cover 1220 are electromagnetic (EM) absorbers 1410, lenses 1500, the parabolic reflectors 1420 corresponding to the parabolic structures 1111-1115, and the front cover including polarizing portions 1430.

According to one embodiment, during operation integrated antenna packages that are mounted on the backside of the electronic assembly 1300 either transmit or receive radar signals through aligned openings that reside in a printed circuit board, the electromagnetic absorber 1410, and the housing cover 1220. Lenses 1500 focus the received and transmitted signals. For example, transmitted signals are reflected off the inside reflective surface of the parabolic reflectors 1420 after passing through a lens aligned with the opening of the absorber 1410. In a transmit portion of the module, the lens shapes the energy from the underlying antenna to more efficiently illuminate the reflector surface, and absorber 1410 absorbs spurious signals, which are undesirable signals internally generated by the module, including harmonics of a desired signal. In a receive portion of the module, received signal are reflected off the inside reflective surface of the parabolic reflector structure 1420 prior to passing through a lens that shapes and focuses the signal energy on an underlying antenna, and absorber 1410 absorbs undesirable external signals, such as signals received from certain undesirable directions.

Figure 36:
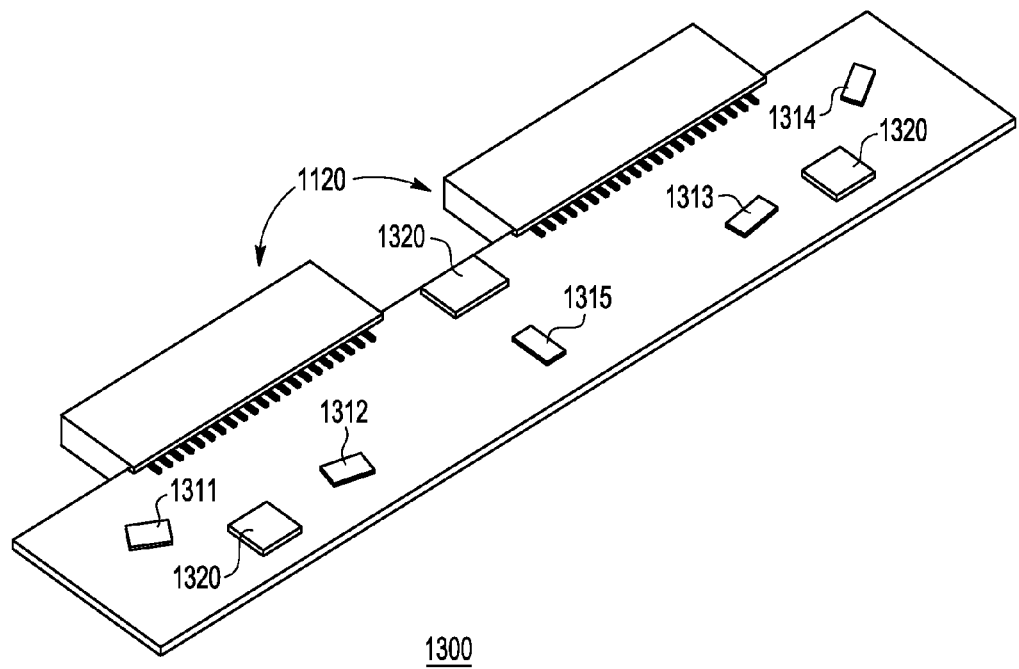
FIG. 36 illustrates an isometric view of a back side of the electronic assembly of FIG. 35 in greater detail in accordance with a specific embodiment of the present disclosure.

FIG. 36 illustrates a portion of the electronic assembly 1300 in greater detail. In particular, FIG. 36 illustrates a backside portion of the electronic assembly including external interface 1120 (connectors), receive devices 1311-1314, a transmit device 1315, and processing/control devices 1320. The transmit devices 1311-1314 and receive device 1315 can be integrated antenna packages (FIG. 1) as previously described or other non integrated device. Processing/control devices, which can include various signal processing or control electronics, can include packaged or flip mounted semiconductor die. When integrated antenna devices of the type previously discussed are used, their respective antenna portions are positioned over corresponding openings in a printed circuit board, as illustrated in greater detail in FIG. 37.

Figure 37:
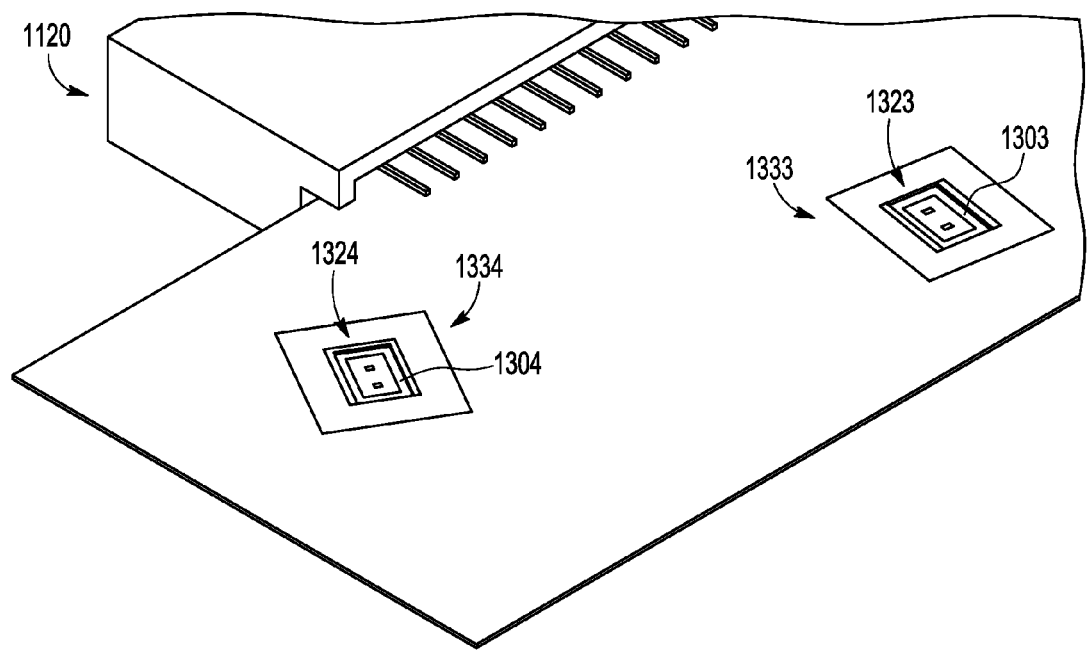
FIG. 37 illustrates an isometric view of a portion of a front side of the electronic assembly of FIG. 36 in greater detail in accordance with a specific embodiment of the present disclosure.

Referring to FIG. 37, antenna portions of devices 1313 and 1314, which are integrated antenna packages, are illustrated at openings in the printed circuit board of the electronic assembly 1300. In particular, portions 1303 and 1304 of the integrated antennas 1313 and 1314, respectively, are illustrated through opening in the printed circuit board, and include patch antennas (not illustrated) to receive a reflected radar signal. Periodic structures, such as EBG structures 1324 and 1323, are integrated into the printed circuit board at corresponding openings. For example, EBG structures 1323 and 1324 can include lossless EBG unit cells surrounding the openings 1323 and 1324, respectively, through which radar signals are received or transmitted. The EBG structures are illustrated in greater detail in FIG. 38.

Figure 38:
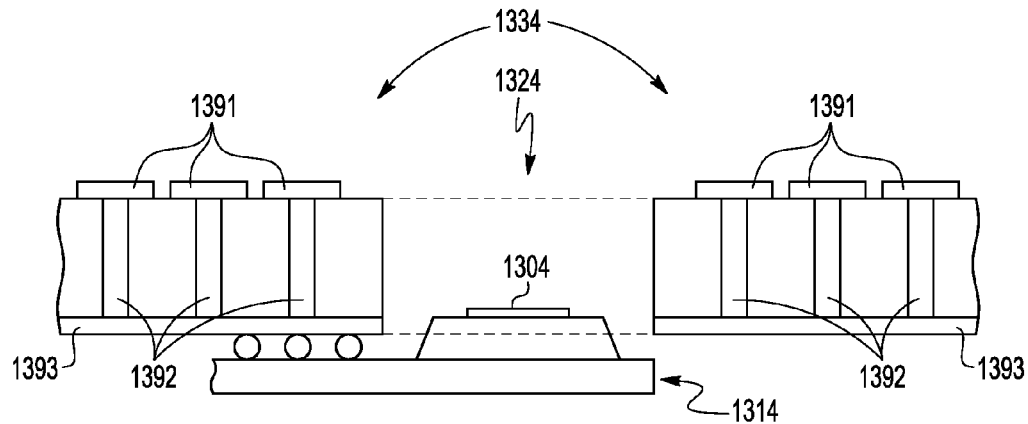
FIG. 38 illustrates a cross-sectional view of a portion of the electronic assembly in greater detail accordance with a specific embodiment of the present disclosure.

FIG. 38 illustrates opening 1324, receive device 1314, and six of a plurality of EBG patches that are associated with corresponding EBG unit cells, three of which define the EBG structure on either side of the opening 1324. The receiver device 1314 is an integrated antenna package that includes solder balls attached to the printed PCB board of the electronic assembly, and an antenna portion 1304 that includes a patch antenna 1334 mounted at the opening 1324. As discussed previously, an EBG structure includes a plurality of EBG unit cells, where each EBG unit cell is defined by the combination of a conductive patch 1391, a through-substrate via 1392, and a ground plane implemented by the backside metal 1393. A period of EBG unit cells is 150 µm at the 77 GHz design frequency of this example. It will be appreciated that each printed circuit board opening will be surrounded by a corresponding EBG structure.

Figure 39:
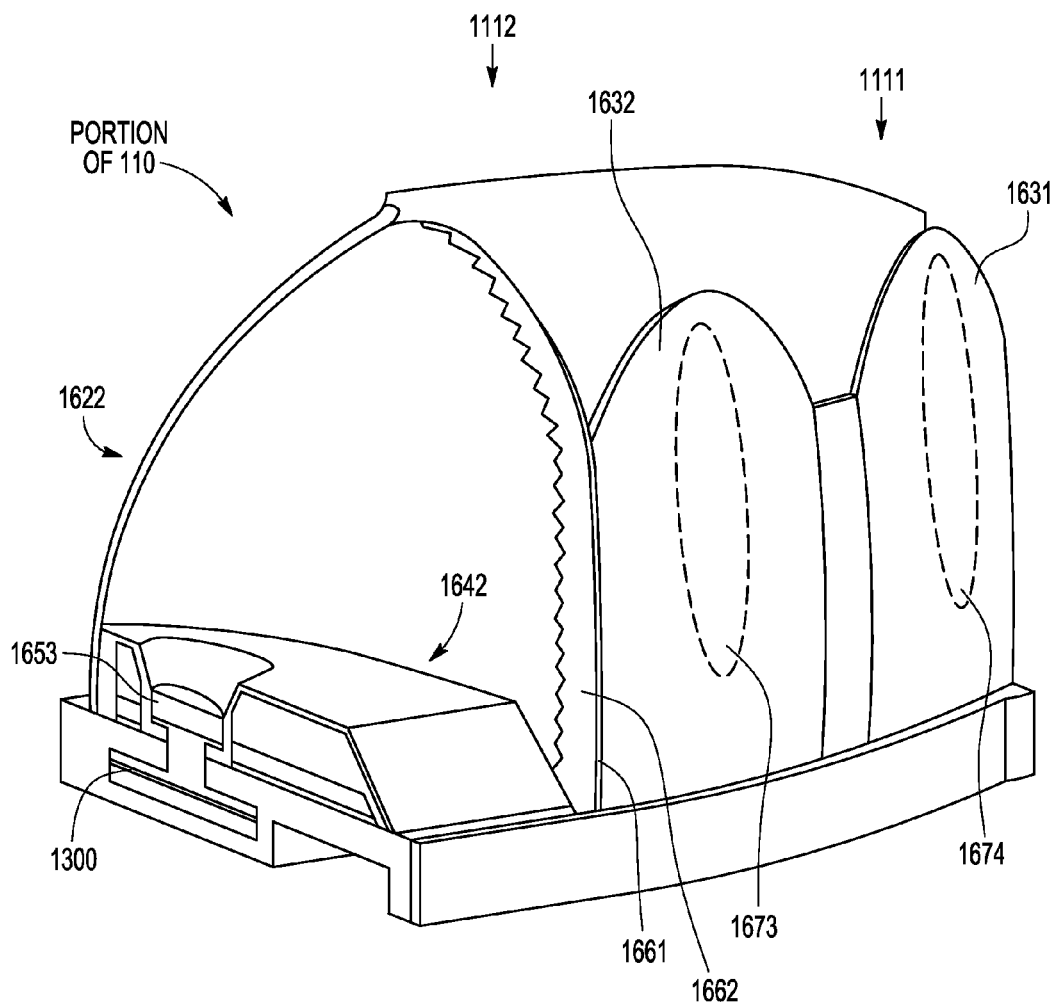
FIG. 39 illustrates an isometric view of the radar module of FIG. 1 in cross-section in accordance with a specific embodiment of the present disclosure.

FIG. 39 illustrates an isometric view of a cross-section of a portion at the parabolic structure 1112 of radar module 1100. The parabolic structure 1112 includes a fence absorber 1642, a reflector portion 1622, a front portion, and a portion of the underlying electronic assembly 1300. The face portion includes a polarizing surface 1632 that includes an aperture 1673 of the parabolic structure 1112 defined by the reflective portion 1622. It will be appreciated that each of the parabolic structures 1111-1115 includes independent radiating apertures, and an edge treatment 1662.

The polarizing surface 1632 polarizes reflected signals received at an aperture 1673, which is defined by the parabolic shape of the reflector portion 1622. In one embodiment the height of the aperture 1673 is greater than 60 mm, such as 67 mm; and depends on the pattern characteristics desired of the final antenna beam. The edge treatment 1662 at the inside of the parabolic structure 1112 is an absorber that reduces undesirable surface currents on edges and suppresses signals from undesired directions. The edge treatment 1662 therefore reduces edge current that would otherwise cause undesirable effects on signal transmissions during operation. The edge treatment 1662 can be any of a variety of commercial materials selected for their absorption characteristics, including absorbers that are magnetic, that include carbon, the like, and combinations thereof.

The fence absorber 1642 is a graded structure that includes an opening aligned with the lens 1653 and an antenna structure of the electronic assembly 1300. An upper portion of the lens 1653 is exposed through the opening of the fence absorber 1642.

Figure 40:
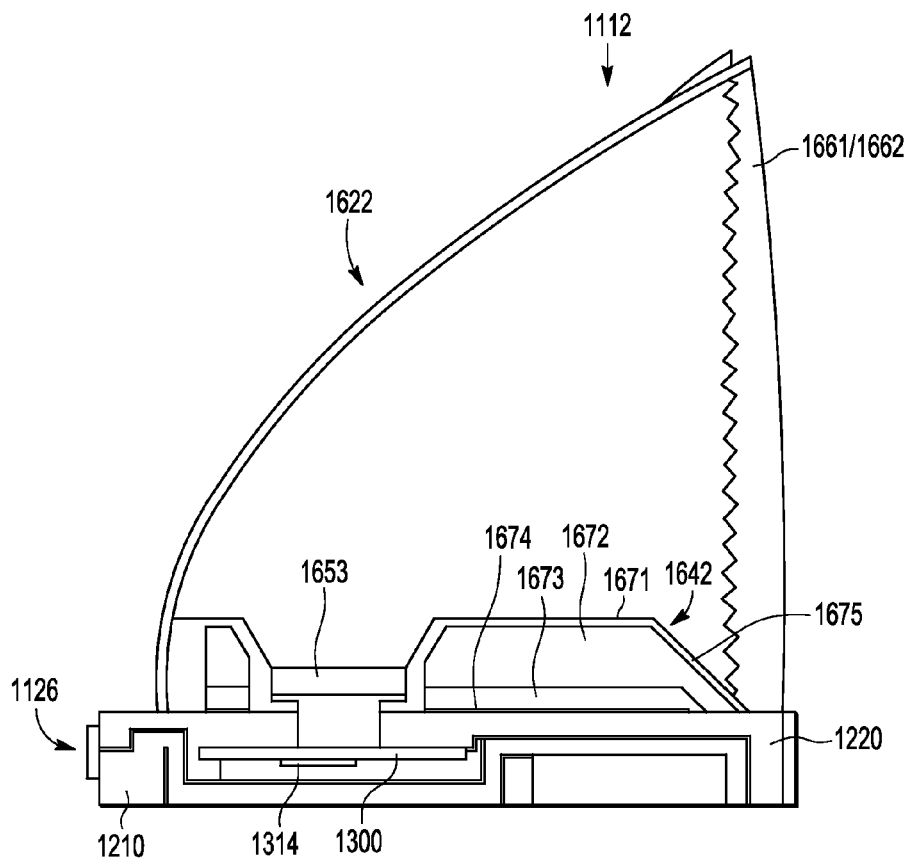
FIG. 40 illustrates a cross-sectional view of the radar module of FIG. 39 in accordance with a specific embodiment of the present disclosure.
Figure 41:
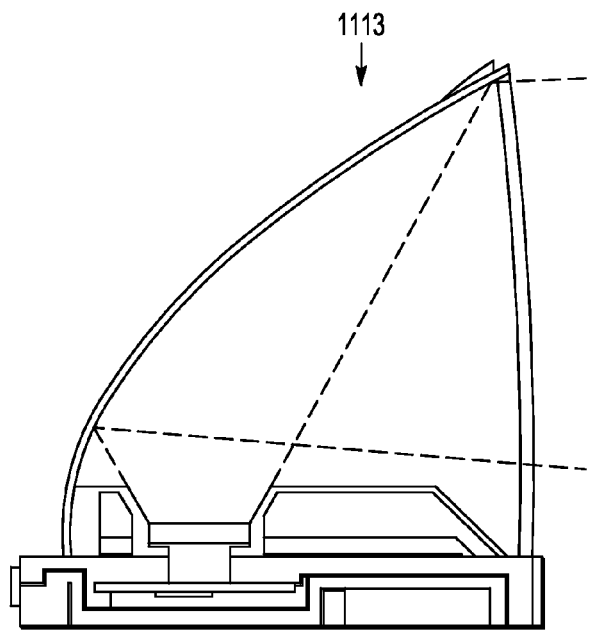
FIG. 41 illustrates a radar signal being reflected in the cross-sectional view of the radar module of FIG. 40 in accordance with a specific embodiment of the present disclosure.

FIG. 40 illustrates in cross-section the parabolic structure 1112 in greater detail. An inside surface of reflector portion 1622 is a high quality reflecting surface that reflects receive signals, such as 77 GHz signals. The high-quality surface can be selectively deposited. For example, the structural portion of reflector portion 1622 can be a plastic material, such as an injection molded structure, that has been metalized along its inside surface to provide a highly reflective surface. The shape of the parabolic structure 1112 defines the aperture 1674 (FIG. 40) of the parabolic structure 1622 and focuses received signals onto the lens 1653 as illustrated at FIG. 41.

Also illustrated at FIG. 40 is the fence absorber 1642. Fence absorber 1642 can be a graded absorber that varies continuously through-out one or more individual levels, varies discretely within one or more individual levels, the like, and combinations thereof to absorb undesirable frequency ranges. For example, a material that defines the fence absorber can have a characteristic that various continuously or discretely throughout one or more levels. The term "continuously" is used with respect to a graded absorber to refer to a characteristic change that is relatively constant throughout a particular level. The term "discretely" is used with respect to a graded absorber to refer to a characteristic change that occurs relatively abruptly between discrete layers of a level. For example, a graded absorber can have a characteristic that varies gradually throughout a material forming a particular level. Examples of such a characteristic can include a physical characteristic such as the presence of a particular material, a ratio of materials, the conductivity of the level, the like, and combinations thereof. Alternatively, characteristic of a graded absorber can vary discretely, as opposed to continuously, by the same amount from the top and bottom, though the characteristic changes more abruptly at a plurality of locations, e.g., discrete layers having difference characteristics result in a "stair step" gradient. Examples of graded absorbers include molded syntactic foams that are tailored to be broad band absorbers by varying the relative amount of materials, such as conductive and non-conductive materials, multiple layers of loaded foams, Multiple layers of magnetically loaded ceramics, the like and combinations thereof.

In the illustrated embodiment, fence absorber 1642 includes a graded absorber having multiple layers that suppress reflections and signals from undesired directions. For example, absorber 1642 can suppress surface currents, and absorbs signals within the volume defined by the printed circuit card and the parabolic reflector. In the illustrated embodiment, fence absorber 1642 is a conductively graded structure that is positioned to absorb high angle incident RF reflections, such as reflections that can occur from road noise or other flat surfaces. The fence structure 1642 includes a portion 1674 at a lower level, i.e., closer the electronic assembly 1300, that is a ¼ wavelength thick, an absorber portion 1673 at an intermediate level that is ¼ wavelength thick, and an absorber portion 1672 at an upper level that is two wavelengths thick. The thickness of the various layers is varied to improve the absorber bandwidth at a particular level. A layer 1671 overlying the absorber portions 1672-1674 of the fence absorber 1642 is a magnetically loaded material that reduces currents on surface edges. Each of the fence absorber portions 1672-1674 include a lower portion that is more conductive that an upper portion. For example, the fence absorber portion 1674 that is ¼ wavelength absorbs ¼ wavelength signals, and has a lower portion within the level at which it resides that is more conductive than an upper portion of its corresponding level. For example, the lower portion of the level can include silver, while upper portion can include conductive carbon material having less silver, or void of silver, that is less conductive than the lower portion of the level. Note that the inside surface of reflector 1622 reflects nearly all of a frequency range near a desired frequency including ¼, ¾, and 2 wavelength signals by substantially the same amount, as opposed to the fence absorber which absorbs nearly all of the ¼, ¾, and 2 wavelength signals.

The fence structure 1642 has an angled, forward-facing, portion that is slanted to reduce surface edge currents generated by received signals.

In operation, as further illustrated in FIG. 41, a reflected radar signal is bounced off the inside reflective surface of the parabolic structure 1111 to the lens 1653, which is selected to focus the signal on to the underlying patch antenna, or to shape a beam selected to illuminate the reflective surface of the reflector. For example, a wide conical beam can be projected onto the underlying antenna element, which is a patch antenna in a particular implementation.

Figure 42:
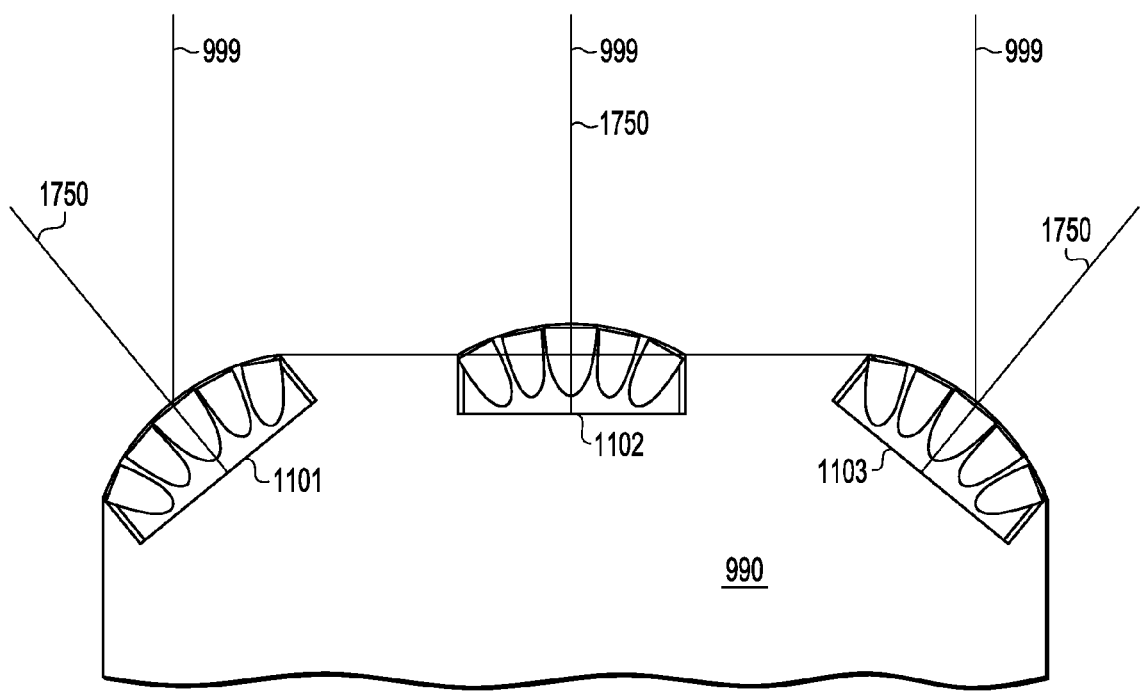
FIG. 42 illustrates a radar module integrated into a motor vehicle in accordance with a specific embodiment of the present disclosure.

FIG. 42 illustrates the front of an automobile 990, e.g., a car, where one or more radar modules can be located. Each radar module physically and electrically interfaces with the automobile by plugging its connector 1120 into a corresponding receptacle (not shown) at the automobile. In particular, radar modules 1101 and 1103 are illustrated mounted near the corners of the vehicle, wherein the curved shape of the radar module 1100 is consistent with a transitional portion of the corner of a car that transitions from a front of the car to a side of the car. In particular it is noted that the midlines 1750 of the modules 1101 and 1103, is offset from a front facing direction 999, which is the forward facing midline of the car. A radar module 1102 has been implemented at the front of car 990 of FIG. 42. In particular it is noted that the midline of the module 1102, which is the midline 1750 illustrated at FIG. 33, is coincident with a front facing direction 999. It will be appreciated that more or less radar modules can be used. For example, only module 1102 could be used, only modules 1101 and 1103 could be used, or all modules could be used. In addition, radar modules can be implemented at other locations of the vehicle, such as at the back of the car. The module can be mounted to provide angular coverage in a single plane and to reject objects out of that plane.

In accordance with at least one embodiment, a method comprises providing an integrated circuit die disposed upon an interposer, the interposer comprising a first major surface that comprises a conductive plane, and a second major surface that comprises a microstrip feedline coupled to transmit a millimeter wave signal generated at the semiconductor die; providing a cover structure comprising a lossy EBG structure that includes a first conductive patch electrically coupled to a second conductive patch, and a lossless EBG structure that includes a third conductive patch electrically isolated from a fourth conductive patch; and coupling the cover structure to the interposer to form a cavity between the cover and the interposer, wherein the integrated circuit die is between the lossy EBG structure and the interposer, and the microstrip antenna is under the lossless EBG structure. In accordance with at least one embodiment, the lossless EBG structure is a first lossless EBG structure, and providing the semiconductor die disposed upon the interposer further comprises the interposer comprising a second lossless EBG structure substantially surrounding the slot resonator.

As used herein, it will be appreciated that the term metamaterial is used to refer to composite materials that may be described by an effective medium model. Generally, a metamaterial is comprised of sub-wavelength inclusions of one or more materials having properties differing from the surrounding matrix. Such metamaterials may be formed to have a variety of electromagnetic properties over a wide range of physical scale sizes, where the design scale is measured in wavelengths. Metamaterials exhibit electromagnetic properties which are generally not found in any single material.

The specific integrated antenna package with a cavity has been determined to mitigate resonances caused by interior metal surfaces of the cavity when used at 77 GHz by incorporating lossy metamaterials, such as lossy EBG structures at the locations described herein, and by incorporating lossless metamaterials, such as lossless EBG structures at the locations described herein. The use of a cavity package avoids over molding methods, which may shift the center frequency of the desired signal, or degrade in transmission loss performance over time due to aging of a polymer mold compound. However, it will be appreciated that the foregoing description describes embodiments that are illustrative of specific examples of an integrated antenna package implementation and a radar module implementation. It will further be appreciated that other embodiments, uses, and advantages of the disclosure will be apparent to those skilled in the art from consideration of the specification and practice of the disclosure disclosed herein. The specification and drawings should be considered exemplary only, and the scope of the disclosure is accordingly intended to be limited only by the following claims and equivalents thereof.

For example, the disclosed radar module can be used in consumer products, e.g., personal, family, or household products, other than cars, such as other road legal vehicles (two-wheel vehicles, busses, and the like), monitoring applications (home security, traffic counting devices, and the like), and others.

It will be appreciated that where particular materials or material characteristics are mentioned herein, that other materials suitable for implementing the same function may be used. For example, the conductive structures and surfaces can be implemented using a variety of conductive materials and dimensions of those materials so long as their operative functionality is maintained. For example, a conductive epoxy with conductivity of less than 0.02 Ohms-cm could be used, or with a conductivity of greater than 0.02 Ohms-cm so long as operation is maintained. In additions, it will be appreciated that other conductive materials besides gold can be used so long as sufficient conductivity is maintained.

It will be further appreciated that while specific dimensions have been provided for a particular embodiment of 77 GHz integrated antenna package, that these dimensions can vary by a tolerance commensurate with their operative functionality at 77 GHz, and can scale by an amount based upon other frequencies of operation to maintain properly tuned operation. For example, at 77 GHz various features that affect the transmission of an RF signal, such as the CPW, microstrip feedline, slot resonator, package size, cavity size, TSV periods, patches, and the like can have dimensions that can vary by a nominal amount. It will be appreciated, however, that at other millimeter wavelength frequencies, these same features may be scaled with the implemented frequency to maintain operation. For example: the average period and size of various EBG patches, and the indicated TSV periods will typically scale to a smaller dimension for higher frequency signals; the slot resonator can have one of many shapes other than the simple I-slot illustrated to provide electromagnetic coupling with wide band performance around the targeted 77 GHz operation, or other targeted operating frequencies; the dimensions of the various cavities described herein will vary with design frequency; the period of TSVs at the periphery of various substrates is selected to be significantly less than the wavelength of a desired signal to reduce RF noise being transmitted through-substrate edges; the size and spacing of the EBG patches can scale with frequency. For example, a period between the TSVs for a 77 GHz design is about $\frac{1}{20}^{th}$ of the freespace wavelength of a 77 GHz signal. While the various TSVs illustrated herein are arrange in a square lattice rotated 45 degrees from an edge, other embodiments can be implemented, such as TSVs arranged in a triangular lattice.

It will also be appreciated that, various implementations of specific features can be replaced with other implementations. For example, it will be appreciated that the periodic EBG structures disclosed herein may be implemented as near-periodic EBG structures, or aperiodic surfaces. The near periodic surfaces disclosed herein may be implemented as periodic or aperiodic. Furthermore, it will be appreciated that other metamaterials, including other lossy and lossless metamaterials, that attenuate TE signals as indicated can be used at the location indicated to obtain desired results. In addition, the lossless EBG unit cells to the right of line 13 of FIG. 17 can be lossy EBG unit cells, where the resistive layer between EBG patches does not extend within the ring portion of conductive structure 129. Other various EBG structures can also be used, such as those disclosed in U.S. patent application Ser. No. 12/711,923, which is incorporated herein by reference in its entirety.

With respect to the disclosed radar module it will be appreciated that the use of the disclosed integrated antenna package as a feed into the larger quasi-optical antenna system provides for a for a low cost and reliable object detections, such as for automotive collision warning and automotive radar collision avoidance systems. However, other types of antenna structures can be used other than that illustrated. For example, a patch antenna can be formed at the PCB board itself, and be fed by any one of various other types of couplers. In addition, the azimuth beam width of respective components and the module itself can vary. For example, the module may facilitate transmission from a parabolic structure having a larger azimuth beam width, such as a 65 degrees, or a smaller azimuth beam width, and may further facilitate a greater or smaller total receive azimuth beam width of the module, such as 120 degrees. A different number of transmit and receive portions can be implemented. For example, multiple transmit portions can be used.

Note that not all of the activities or elements described above in the general description are required, that a portion of a specific activity or device may not be required, and that one or more further activities may be performed, or elements included, in addition to those described. Still further, the order in which activities are listed is not necessarily the order in which they are performed.

Also, the concepts have been described with reference to specific embodiments. However, one of ordinary skill in the art appreciates that various modifications and changes can be made without departing from the scope of the present disclosure as set forth in the claims below.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

What is claimed is:

1. A packaged device comprising:
   an integrated circuit die coupled to a first side of an interposer, the integrated circuit die to receive a millimeter wavelength signal;
   a microstrip feedline on the first side of the interposer, the microstrip feedline coupled to the integrated circuit die to receive the millimeter wavelength signal;
   a ground plane on a second side of the interposer, the second side opposing the first side, the ground plane comprising a slot resonator aligned over an end portion of the microstrip feedline;
   an antenna structure attached to the second side of the interposer, a cavity formed between the antenna structure and the ground plane on the second side, the cavity aligned with the slot resonator; and
   a cover overlying the integrated circuit die and the microstrip feedline, an air-filled gap resides between the cover and the die and overlies the die, the cover comprising a lossy EBG structure directly overlying the integrated circuit die, and a lossless EBG structure directly overlying the microstrip feedline.

2. The device of claim 1, wherein a first effective resistance between a first conductive patch and a second conductive patch of the lossy EBG structure is less than a second effective resistance between a third conductive patch and a fourth conductive patch of the lossless EBG structure, the first and second conductive patches adjacent to each other, and the third and fourth conductive patches adjacent to each other.

3. The device of claim 2, wherein the second effective resistance is at least ten times greater than the first resistance.

4. The device of claim 2, wherein the first effective resistance is based upon a first portion of a first layer that has a first sheet resistance that is less than a second sheet resistance of a second layer, the first layer couples the first conductive patch to the second conductive patch, and the second layer couples the third conductive patch to the fourth conductive patch.

5. The device of claim 4, wherein the second effective sheet resistance is at least ten times greater than the first sheet resistance.

6. The device of claim 2, wherein an average period between a plurality of adjacent conductive patches that includes the first patch and the second patch is 250 um.

7. The device of claim 6, wherein each conductive patch of the plurality of conductive patches is square with a length of approximately 230 um.

8. The device of claim 1, wherein the lossless EBG structure includes a plurality of levels of conductive patches.

9. The device of claim 1 wherein the lossy EBG structure is a first lossy EBG structure and the device further comprises:
   a second lossy EBG structure directly underlying the integrated circuit die, wherein the integrated circuit is between the first lossy EBG structure and the second lossy EBG structure.

10. The device of claim 1, wherein the lossless EBG structure is a first lossless EBG structure and the antenna structure further comprises:
    a patch antenna attached to an outer surface of the antenna structure, the patch antenna aligned with the slot resonator, and
    a second lossless EBG structure at a periphery location of the antenna structure.

11. The device of claim 1, wherein the microstrip feedline has a width dimension of 160 um.

12. The device of claim 1, wherein a second air filled gap is between the integrated circuit die and the interposer.

13. The device of claim 1, wherein the slot resonator comprises an I-shaped opening in the ground plane.

14. The device of claim 1, further comprising:
    a conductive structure on the first side of the interposer, wherein the microstrip feedline is surrounded by an aperture in the conductive structure and an array of EBG unit cells surrounds the conductive structure.

15. The device of claim 14, wherein
    a first portion of the array of EBG unit cells comprises lossless EBG unit cells surrounding at least the aperture of the conductive structure, and
    a second portion of the array of EBG unit cells comprises lossy EBG unit cells surrounding at least a portion of the conductive structure that underlies the integrated circuit die.

16. The device of claim 14, wherein the device further comprises:
    a coplanar waveguide on the first side of the interposer, the coplanar waveguide coupled between the microstrip feedline and the integrated circuit die, the coplanar waveguide comprising a conductive portion connected to the microstrip feedline, and a portion of the conductive structure that surrounds the conductive portion and is separated from the conductive portion.

17. A method comprising:
    absorbing TE modes of a first frequency range of a first radio frequency signal, emitted from an integrated circuit die coupled to a first side of an interposer, based upon a lossy EBG structure formed in a cover overlying the integrated circuit die, wherein an air-filled gap resides between the cover and the integrated die, the lossy EBG structure including a first effective resistance between a first conductive patch and a second conductive patch, wherein the first radio frequency signal is propagating over and in a direction parallel to the integrated circuit die, a backside metal of the integrated circuit die directly underlying the first and second conductive patches; and
    reactively attenuating TE modes of the first frequency range of a second radio frequency signal, emitted from a slot resonator formed in a ground plane on a second side of the interposer, based upon a lossless EBG structure formed in the cover overlying the slot resonator, wherein a cavity resides between the slot resonator and an antenna structure attached to the second side of the interposer, the lossless EBG structure including a second effective resistance electrically coupling a third conductive patch to a fourth conductive patch, and the second effective resistance is at least ten times greater than the first effective resistance, and a microstrip feedline is coupled to the integrated circuit die on the first side of the interposer, the microstrip feedline located between the slot resonator and the lossless EBG structure.

18. The method of claim 17 wherein the lossy EBG structure is a first lossy EBG structure and the method further comprises:

absorbing TE modes of the first frequency range of the first radio frequency signal based upon a second lossy EBG structure including a fifth conductive patch and a sixth conductive patch, the integrated circuit die is located between the fifth conductive patch and the first conductive patch.

19. The method of claim 17, wherein the first and third conductive patches are formed from a common conductive layer.

20. The method of claim 18, wherein a third effective resistance between the fifth and sixth conductive patches is at least ten times less than the second effective resistance.

21. A packaged device comprising:

an integrated circuit die coupled to a first side of an interposer, the integrated circuit die to provide a millimeter wavelength signal;

the interposer comprising a microstrip feedline on the first side of the interposer, the microstrip feedline coupled to the integrated circuit die to receive the millimeter wavelength signal;

the interposer further comprising a ground plane on a second side of the interposer, the second side opposing the first side, the ground plane comprising a slot resonator aligned over an end portion of the microstrip feedline;

an antenna structure attached to the second side of the interposer, a cavity formed between the antenna structure and the ground plane on the second side, the cavity aligned with the slot resonator; and a cover overlying the integrated circuit die and the microstrip feedline, an air-filled gap resides between the cover and the die and overlies the die, the cover comprising: a first metamaterial structure at a first location to absorb power in a TE mode of a package including the integrated circuit die, the interposer and the cover, the integrated circuit die between the interposer and the first location; and a second metamaterial structure at a second location to not absorb power in the TE mode of the package, the microstrip feedline between the slot resonator and second location.

* * * * *